United States Patent
Purayath et al.

(10) Patent No.: US 10,468,259 B2
(45) Date of Patent: Nov. 5, 2019

(54) CHARGE-TRAP LAYER SEPARATION AND WORD-LINE ISOLATION IN A 3-D NAND STRUCTURE

(71) Applicant: Applied Materials, Inc., Santa Clara, CA (US)

(72) Inventors: Vinod Robert Purayath, Cupertino, CA (US); Nitin K. Ingle, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/966,787

(22) Filed: Apr. 30, 2018

(65) Prior Publication Data
US 2018/0254187 A1    Sep. 6, 2018

Related U.S. Application Data

(62) Division of application No. 15/423,543, filed on Feb. 2, 2017, now Pat. No. 9,960,045.

(51) Int. Cl.
| | |
|---|---|
| H01L 27/115 | (2017.01) |
| H01L 21/28 | (2006.01) |
| H01L 27/11582 | (2017.01) |
| H01L 29/06 | (2006.01) |
| H01L 27/1157 | (2017.01) |

(52) U.S. Cl.
CPC .. *H01L 21/28282* (2013.01); *H01L 27/11582* (2013.01); *H01L 29/0649* (2013.01); *H01L 27/1157* (2013.01)

(58) Field of Classification Search
CPC .......... H01L 21/28282; H01L 29/0649; H01L 27/1157; H01L 27/11582
See application file for complete search history.

(56) References Cited

U.S. PATENT DOCUMENTS

| | | |
|---|---|---|
| 9,659,955 B1 | 5/2017 | Sharangpani et al. |
| 2010/0181610 A1 | 7/2010 | Kim et al. |
| 2015/0364483 A1* | 12/2015 | Koval .............. H01L 27/11524 438/257 |
| 2015/0380423 A1* | 12/2015 | Kanakamedala ............................ H01L 27/11556 438/264 |
| 2016/0268283 A1* | 9/2016 | Kitamura .......... H01L 27/11582 |

* cited by examiner

*Primary Examiner* — Selim U Ahmed
(74) *Attorney, Agent, or Firm* — Patterson + Sheridan LLP

(57) ABSTRACT

In a 3D NAND device, the charge trap region of a memory cell is formed as a separate charge-trap "island." As a result, the charge-trap region of one memory cell is electrically isolated from charge-trap regions in adjacent memory cells. The charge trap region of one memory cell is separated from the charge trap regions of adjacent memory cells by a dielectric structure, such as a silicon oxide film. Alternatively, the charge trap region of a memory cell is separated from the charge trap regions of adjacent memory cells by an air, gas, or vacuum gap.

17 Claims, 29 Drawing Sheets

US 10,468,259 B2

CHARGE-TRAP LAYER SEPARATION AND WORD-LINE ISOLATION IN A 3-D NAND STRUCTURE

CROSS-REFERENCE TO RELATED APPLICATIONS

This application is a divisional of U.S. patent application Ser. No. 15/423,543, filed Feb. 2, 2017, which is herein incorporated by reference in its entirety.

BACKGROUND

Field

Embodiments described herein generally relate to processing semiconductor substrates, and more particularly, to charge-trap layer separation and word-line isolation in a 3-D NAND structure.

Description of the Related Art

To address challenges encountered in scaling planar (2D) NAND memory devices to achieve higher densities at a lower cost per bit, ultra-high density, three-dimensional (3D) stacked memory structures have been introduced. Such 3D memory structures are sometimes referred to as having a Bit Cost Scalable (BiCS) architecture, and include strings of vertically aligned memory cells. Typically, the vertically aligned memory cells are formed from an array of alternating conductor and insulator layers, where the conductive layers correspond to the word lines of the memory structure.

As the number of vertically stacked memory cells in 3D NAND devices increases, the aspect ratio of memory cell strings also increases, introducing numerous manufacturing issues, including difficulty in maintaining memory hole uniformity and minimizing variation in memory cell dimensions. To minimize the aspect ratio of memory cell stacks, and thereby avoid such issues, the thickness of the alternating conductor and insulator layers used to form memory cells is generally scaled down. However, with thinner insulator layers, memory cells in a NAND string are more closely spaced, and leakage of trapped charges in such memory cells may occur, compromising stored data or bits. In addition, when memory cells are more closely spaced, fringing effects caused by the rectangular cross-section of a memory cell can further affect charge stored in neighboring memory cells.

Accordingly, there is a need in the art for 3D NAND memory cells that are not prone to trapped charge leakage into adjacent memory cells or to otherwise affecting charge stored in neighboring memory cells.

SUMMARY

Embodiments described herein generally relate to 3-D NAND structures and methods of forming the same. In one embodiment, a method of forming a plurality of nonvolatile memory cells includes forming a hole in a stack of alternating insulator layers and memory cell layers to expose an edge surface of each layer in the stack, performing an isotropic etch process on the edge surface of each layer to selectively remove a portion of each memory cell layer and form first cavities between the insulator layers, wherein each memory cell layer includes an exposed portion adjacent to one of the first cavities, and oxidizing the exposed portion of each memory cell layer so that an oxide region is formed between insulator layers adjacent to the exposed portion, wherein a remaining portion of the memory cell layer is disposed between the insulator layers adjacent to the exposed portion. The method further includes depositing a charge trap material in the first cavities, performing a selective etch process on the remaining portion of each memory cell layer to form second cavities that are disposed between the insulator layers, and, in each of the second cavities, forming a control gate for one of the plurality of nonvolatile memory cells.

In another embodiment, a method of forming a plurality of nonvolatile memory cells includes forming a hole in a stack of alternating insulator layers and memory cell layers, conformally depositing a charge trap layer on exposed surfaces in the hole, for each of the plurality of nonvolatile memory cells, forming a control gate from at least a portion of a memory cell layer, performing a first selective etch process on an exposed surface of each insulator layer to remove the insulator layers and form an air gap between adjacent nonvolatile memory cells, and performing a second selective etch process on portions of the charge trap layer that are each exposed to one of the air gaps, so that each nonvolatile memory cell includes a portion of the charge trap layer that is electrically separated from the portion of the charge trap layer in adjacent nonvolatile memory cells.

In another embodiment, a three-dimensional NAND device comprises a first nonvolatile memory cell and a second nonvolatile memory cell that is adjacent to the first nonvolatile memory cell. The first nonvolatile memory cell includes a first charge trap region that contacts a gate oxide layer and a first control gate separated from the first charge trap region by a first blocking oxide region. The second nonvolatile memory cell includes a second charge trap region that contacts the gate oxide layer, wherein the second charge trap region and the first charge trap region are physically separated from each other by a gap, and a second control gate separated from the second charge trap region by a second blocking oxide region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Figure 1:
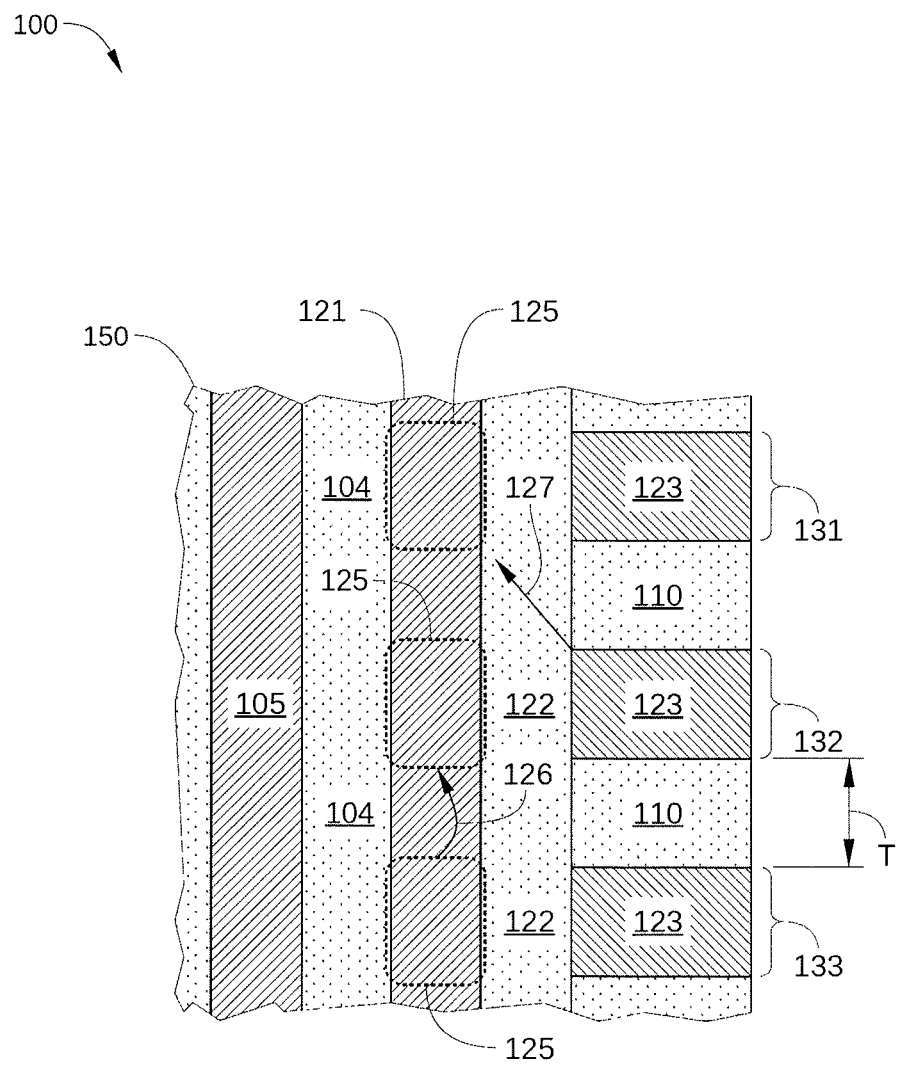
FIG. 1 is a schematic cross-sectional view of a portion of a conventional three-dimensional (3D) NAND memory device.

In a conventional three-dimensional (3D) NAND memory device, the charge storage region of a memory cell may be susceptible to leakage of trapped charge into or out of the charge storage region of adjacent memory cells, compromising stored data, as illustrated in FIG. 1. FIG. 1 is a schematic cross-sectional view of a portion 150 of a conventional three-dimensional (3D) NAND memory device 100. Portion 150 includes memory cells 131, 132, and 133, each separated by insulator layers 110, such as silicon dioxide layers. Each of memory cells 131-133 includes a separate control gate 123 for programming the associated memory cell. By contrast, a single blocking gate oxide layer 104 forms the gate oxide for each of memory cells 131-133, a single charge trap layer 121 provides the charge trap region 125 for each of memory cells 131-133, and a single blocking oxide layer 122 is generally disposed between control gates 123 and charge trap layer 121.

At a positive gate bias, electrons can tunnel from channel layer 105 through ultra-thin gate oxide layer 104 to charge trap layer 121, and are subsequently trapped. Silicon nitride ($Si_3N_4$), for example, has an intrinsic property of trapping charge (electrons or holes). As thickness T of insulator layers 110 is reduced in thickness, charge trapped in the charge trap region 125 of one memory cell can leak into the charge trap region of an adjacent memory cell, for example via electron hopping 126. For example, when thickness T is less than about 15-20 nm, electron hopping 126 can occur. In addition, the relatively sharp corners of control gates 123 can produce fringing effects 127 that can also affect charge trapped in the charge trap region 125 of adjacent memory cells.

Novel 3D NAND Memory Cells

Embodiments described herein generally relate to 3D NAND memory devices with improved word-line isolation and methods of forming the same. Specifically, for each memory cell of a vertical NAND string, the charge trap region, which serves as the charge storage region of each memory cell, is formed as a separate charge-trap "island." As a result, the charge-trap region of one memory cell is electrically isolated from adjacent charge-trap regions in adjacent memory cells. Thus, a single charge-trap layer that is adjacent to all memory cells in the vertical NAND string is not present. In some embodiments, the charge trap region of one memory cell is separated from the charge trap regions of adjacent memory cells by a dielectric structure, such as a silicon oxide film. In other embodiments, the charge trap region of a memory cell is separated from the charge trap regions of adjacent memory cells by an air, gas, or vacuum-containing spatial gap.

Figure 2:
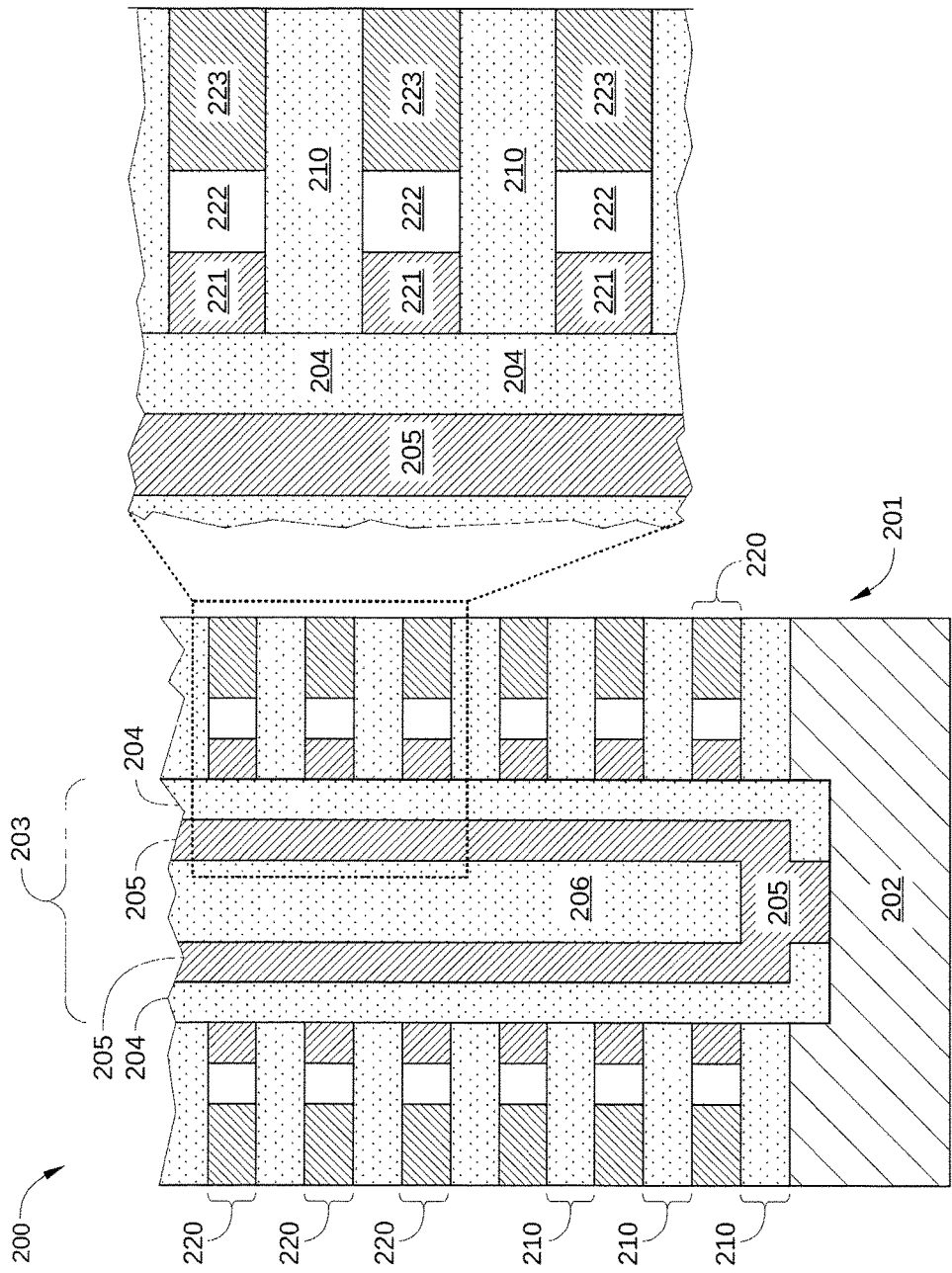
FIG. 2 shows a schematic cross-sectional view of a portion of a 3D NAND memory device, according to an embodiment of the disclosure.

FIG. 2 shows a schematic cross-sectional view of a portion of a 3D NAND memory device 200, according to an embodiment of the disclosure. 3D NAND memory device 200 is a Bit Cost Scalable (BiCS) device, and includes a string 201 of vertically stacked memory cells formed on a semiconductor substrate 202. String 201 includes a plurality of memory cells 220 alternately disposed between a plurality of insulator layers 210. As shown, insulator layers 210 and memory cells 220 are formed around a memory hole 203, in which a gate oxide layer 204, a polysilicon channel 205, and a filler material 206 are disposed. String 201 further includes a select gate coupled to a source line (not shown) and a select gate coupled to a bit line (not shown) that are each separately coupled to control gates 223 within the various memory cells 220. In the embodiment illustrated in FIG. 2, string 201 is configured as a single vertical structure, but in other embodiments, string 201 may be configured as a U-shaped structure with two vertical columns. "Top," "up," and "upward" are used herein to describe elements or directions perpendicularly distal from the plane of semiconductor substrate 202 and the center of mass of semiconductor substrate 202. Similarly, "vertical" is used to describe elements or directions aligned in the "upward" direction, i.e., towards the "top".

Semiconductor substrate 202 may be any suitable starting material for forming integrated circuits, such as a silicon (Si) wafer or a germanium (Ge) wafer. Semiconductor substrate 202 may be a silicon semiconductor substrate having a layer or layers formed thereon, such as a film stack, employed to form a structure on semiconductor substrate 202, such as 3D NAND memory device 200. Semiconductor substrate 202 may include a material such as crystalline silicon (e.g., Si<100> or Si<111>), silicon oxide, strained silicon, silicon germanium, doped or undoped polysilicon, doped or undoped silicon, patterned or non-patterned wafer, silicon on insulator (SOI), carbon-doped silicon oxides, silicon nitride, doped silicon, germanium, gallium arsenide, glass, sapphire, metal layers disposed on silicon, and the like. Semiconductor substrate 202 may be configured as a 200 mm, 300 mm, or 450 mm diameter wafer, or as a rectangular or square panel.

Gate oxide layer 204 is configured as a gate oxide for each of memory cells 220, and includes a suitable dielectric material, such as silicon dioxide. Channel 205 is a conductive structure that provides electrons to the charge trap region (described below) of each memory cell 220. For example, in some embodiments, channel 205 includes a doped or undoped polycrystalline silicon material.

Isolator layers 210 are disposed between and electrically isolate memory cells 220. Isolator layers 210 may be any suitable electrically isolating material, such as a TEOS-formed silicon dioxide.

Each of memory cells 220 corresponds to a word line of 3D NAND memory device 200, each word line extending into the page to form additional memory cells of 3D NAND memory device 200 that are not visible. Thus, each memory cell 220 is configured to store one or more bits of data. As such, each memory cell 220 includes a charge trap region 221, a blocking oxide 222, and a control gate 223. Charge trap region 221 is the charge storage region of a memory cell 220. According to embodiments of the disclosure, each charge trap region 221 is formed from a portion of a charge trap layer, such as a silicon nitride ($Si_3N_4$) layer, that is ultimately separated into individual "charge trap islands," one for each memory cell 220, as described below. Blocking oxide 222 generally includes a material that prevents or reduces diffusion of metal atoms from control gate 223 into gate oxide 204 and isolates the control gate 223 from the charge trap region 221. Control gate 223 includes a conductive material and is configured to enable a particular voltage to be applied proximate charge trap region 221 when programming memory cell 220.

Because each charge trap region 221 is physically separated from the charge trap region 221 of adjacent memory cells, electron hopping can no longer occur, even when the thickness of insulator layers 210 is less than 150-200 nm. In addition, because insulator layers 210 extend between charge trap regions 221 of adjacent memory cells 220, charge trap regions 221 are electrically shielded from fringing effects caused by the relatively sharp corners of control gates 223.

According to various embodiments, a novel charge-trap region may be formed via a "gate-last" fabrication process, in which the gate structure for each memory cell in a 3D NAND device is formed after substantially all other elements of the memory cell have been formed. Alternatively, the novel charge-trap layer may be formed via a "gate-first" fabrication process, in which at least a portion of the gate structure for each memory cell is formed from conductive material originally deposited between the insulator layers of the memory cell string.

Gate-Last Memory Cell Fabrication

Figure 3:
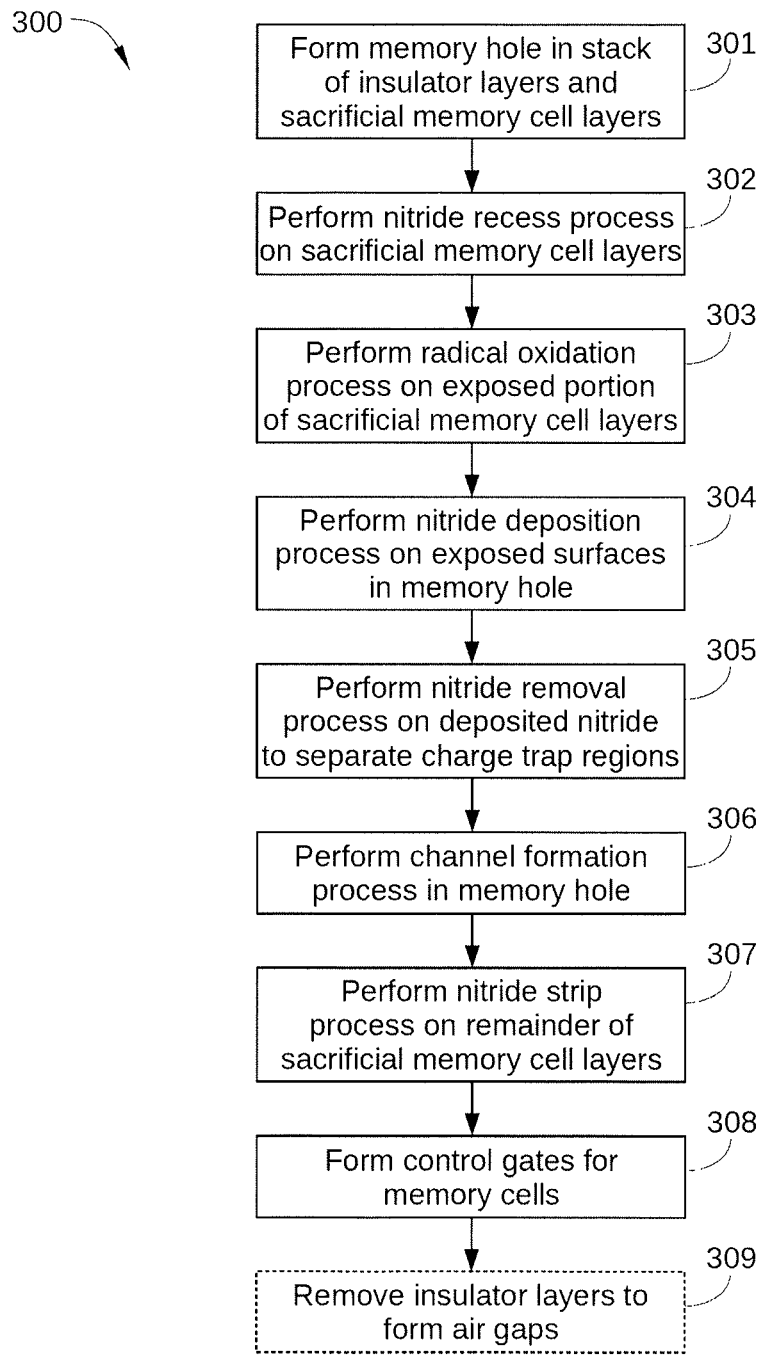
FIG. 3 sets forth a flow chart of process steps for forming memory cells in a 3D NAND memory device, according to various embodiments of the disclosure.

FIG. 3 sets forth a flow chart of process steps for forming memory cells in a 3D NAND memory device, according to various embodiments of the disclosure. FIGS. 4A-4I are schematic cross-sectional views of 3D NAND memory device 200 corresponding to different stages of the process of FIG. 3, according to various embodiments of the disclosure.

Figure 4A:
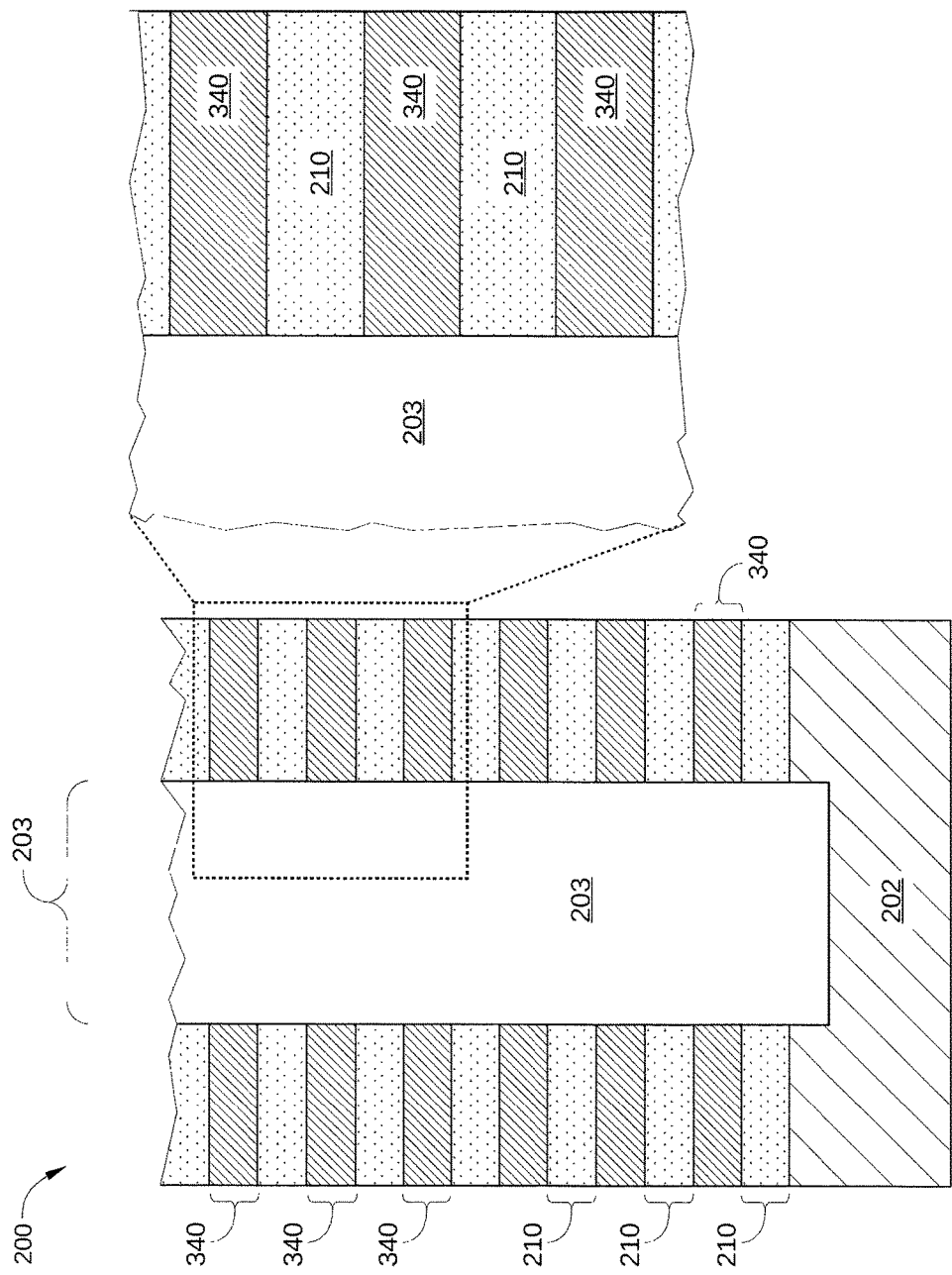
FIGS. 4A-4I are schematic cross-sectional views of the 3D NAND memory device of FIG. 2 corresponding to different stages of the process of FIG. 3, according to various embodiments of the disclosure.

Method 300 begins in step 301, in which memory hole 203 is formed in a stack of alternating insulator layers 210 and sacrificial memory cell layers 340 deposited on semiconductor substrate 202, as shown in FIG. 4A. Any suitable etching method may be employed to form memory hole 203, such as deep reactive-ion etching (DRIE), a highly anisotropic etch process employed to create high aspect-ratio holes and trenches in wafers or other substrates. In some embodiments, sacrificial memory cell layers 340 are $Si_3N_4$ layers.

Figure 4B:
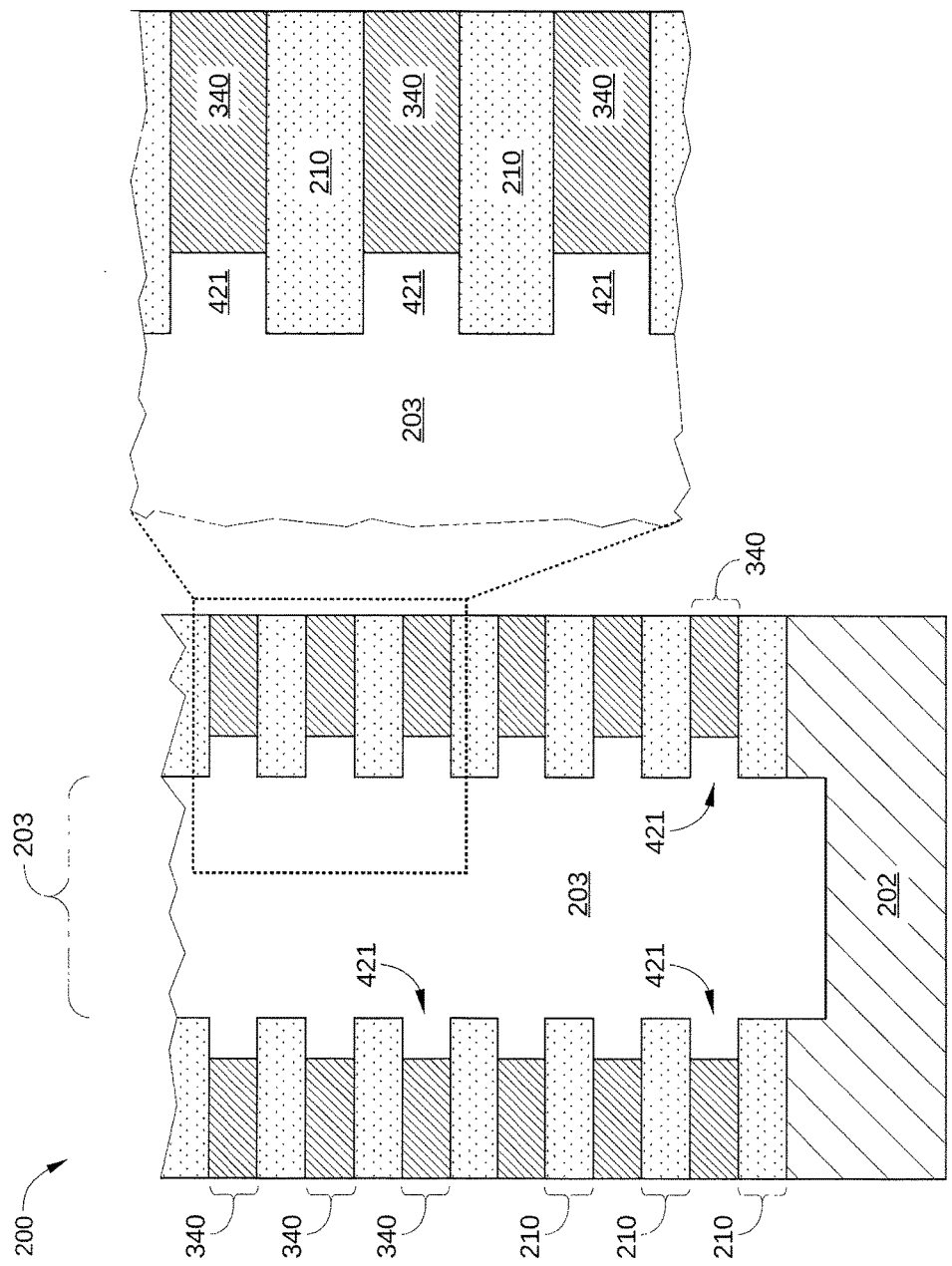

In step 302, a nitride recess process is performed to remove an exposed portion of sacrificial memory cell layers 340, as shown in FIG. 4B. The nitride recess process of step 302 is performed on edge surfaces of insulator layers 210 and sacrificial memory cell layers 340 that are exposed to memory hole 303. Generally any isotropic etch process that is selective to at least the material of insulator layers 210 may be employed in step 302 to remove a portion of sacrificial memory cell layers 340 with high selectivity. For example, in some embodiments, a portion of sacrificial memory cell layers 340 is removed with a reactive species that is formed via a remote plasma from a process gas comprising oxygen ($O_2$) and nitrogen trifluoride ($NF_3$). More specifically, a fluorine-containing precursor and, in some embodiments, an oxygen-containing precursor are flowed into a remote plasma region while striking a plasma to form plasma effluents that then flow through a showerhead into a substrate processing region housing semiconductor substrate 202. Highly selective dry etching processes that may be used for the removal of $Si_3N_4$ layers in this way are described in U.S. Pat. No. 9,165,786, entitled "Integrated oxide and nitride recess for better channel contact in 3D architectures" and filed Aug. 5, 2014.

In one example of a dry etching process, a flow of nitrogen trifluoride and oxygen ($O_2$) is introduced into a remote plasma region separate from and fluidly coupled to a substrate processing region, where the nitrogen trifluoride is excited in a remote plasma struck within the remote plasma region. More generally, a fluorine-containing precursor and an oxygen-containing precursor may be flowed into the remote plasma region. The fluorine-containing precursor comprises at least one precursor selected from the group consisting of atomic fluorine, diatomic fluorine, bromine trifluoride, chlorine trifluoride, nitrogen trifluoride, hydrogen fluoride, fluorinated hydrocarbons, sulfur hexafluoride and xenon difluoride in embodiments. The oxygen-containing precursor may be one of atomic oxygen, molecular oxygen ($O_2$), ozone ($O_3$), nitrogen dioxide or nitrous oxide in embodiments. Plasma effluents are formed and passed into the substrate processing region housing semiconductor substrate 202, thereby removing a portion of sacrificial memory cell layers 340, as shown in FIG. 3B. The plasmas described herein may include one or more relatively inert gases, such as He, $N_2$, Ar, that can be used to improve plasma stability or process uniformity. Flow rates and ratios of the different gases may be used to control etch rates and etch selectivity.

In embodiments described herein, the fluorine-containing gas (e.g., $NF_3$) is supplied at a flow rate of between about 5 sccm (standard cubic centimeters per minute) and 400 sccm, helium at a flow rate of between about 0 slm (standard liters per minute) and 3 slm, and $N_2$ at a flow rate of between about 0 slm and 3 slm. The flow rates of ammonia, the oxygen-containing precursor, the alcohol, and moisture vary widely and are selected to choose a desirable etch rate and etch selectivity of the target etch material. One of ordinary skill in the art would recognize that other gases and/or flows may be used depending on a number of factors, including processing chamber configuration, substrate size and geometry, and layout of features being etched. In addition to the other embodiments described herein, the pressure in the remote plasma region and/or the substrate processing region during all selective etch processes may be between about 0.01 Torr and about 30 Torr or between about 1 Torr and about 5 Torr in embodiments. In embodiments, an ion suppressor (which may be a showerhead) may be used to provide radical and/or neutral species for gas-phase etching. The ion suppressor may also be referred to as an ion suppression element. In embodiments, for example, the ion suppressor is used to filter etching plasma effluents (including radical-fluorine) en route from the remote plasma region to the substrate processing region. The ion suppressor may be used to provide a reactive gas having a higher concentration of radicals than ions. Plasma effluents pass through the ion suppressor disposed between the remote plasma region and the substrate processing region. The ion suppressor functions to dramatically reduce or substantially eliminate ionic species traveling from the plasma generation region to the substrate.

Generally, the quantity of $Si_3N_4$ material removed in step 302 is sufficient for the subsequent formation of the isolated charge trap regions 221, shown in FIG. 2. Thus cavities 421 formed between insulator layers 210 in step 302 have substantially the same size as the subsequently formed charge trap regions 221.

The nitride recessing process of step 302 may be performed in a suitable etch chamber that is configured to selectively remove a portion of sacrificial memory cell layers 340, such as the Selectra™ process chamber, available from Applied Materials, Inc. of Santa Clara, Calif., and the like. In particular, an etch chamber configured with a dual channel showerhead enables an etching process that allows for separation of etchants outside of the processing region, thereby providing limited interaction with chamber components and each other prior to being delivered into the processing region. The etch chamber employed in step 302 may be a standalone chamber, or part of a cluster tool, such as one of the ENDURA line of cluster tools, also available from Applied Materials, Inc.

Figure 4C:
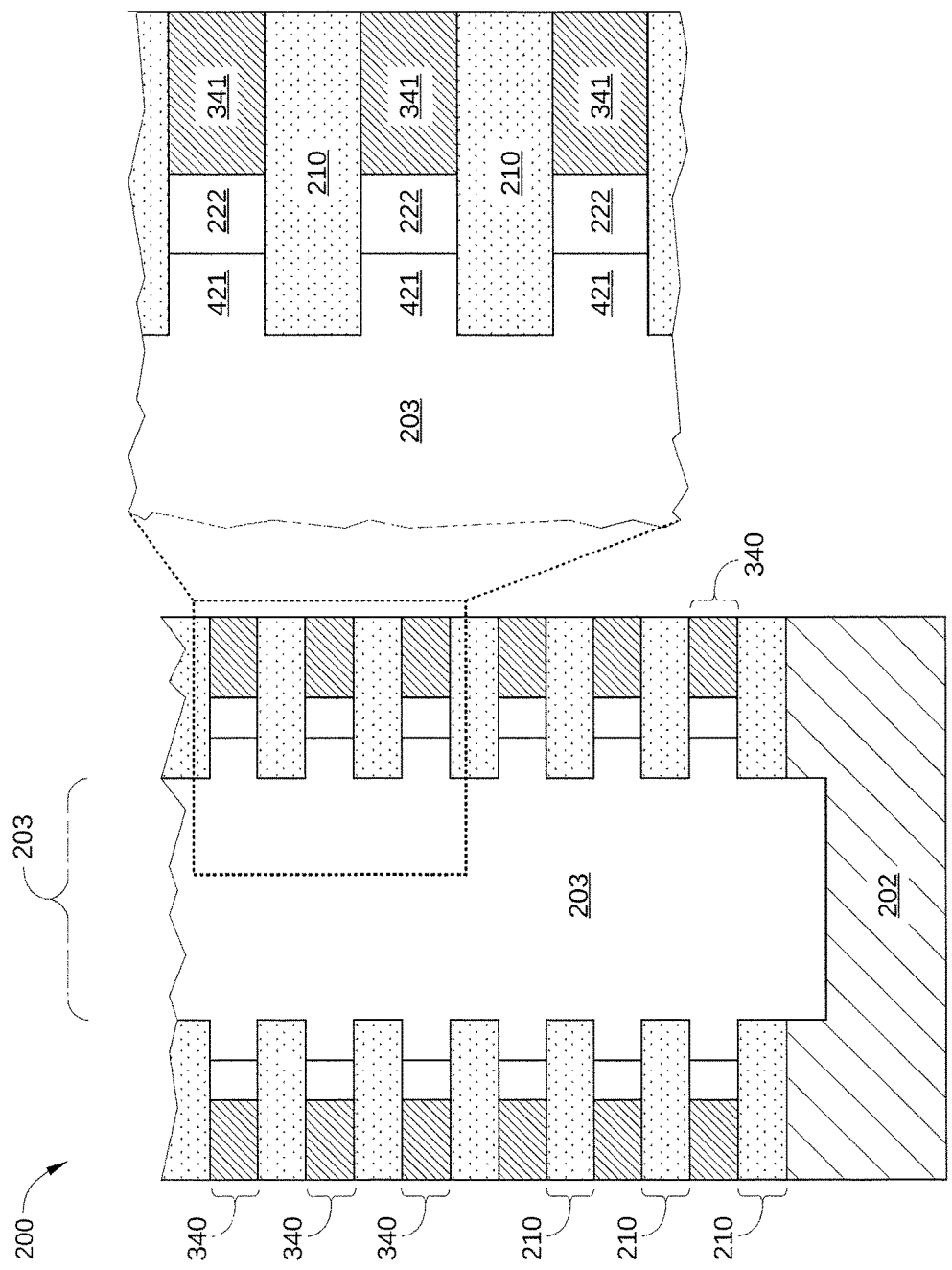

In step 303, a radical oxidation process is performed to form blocking oxides 222 by oxidizing an exposed portion of sacrificial memory cell layers 340, as shown in FIG. 4C. Generally, any isotropic oxidation process suitable for uniformly oxidizing sacrificial memory cell layers 340 for each memory cell 220 of 3D NAND memory device 200 may be employed in step 302. For example, in some embodiments, a portion of sacrificial memory cell layers 340 is converted to blocking oxide 222 with a reactive species that is formed via a remote plasma. One such radical oxidation process is described in U.S. Patent Application 2011/0061812, entitled "Apparatus and Methods for Cyclical Oxidation and Etching" and filed Mar. 10, 2010. Generally, the quantity of $Si_3N_4$ converted to blocking oxide 222 is determined based on what thickness of blocking oxide 222 is suitable for the specific materials employed in memory cells 220 and the process temperatures employed in forming the same. Upon completion of step 303, a portion of sacrificial memory cell layers 340 is converted to blocking oxide 222 and a remainder portion 341 of sacrificial memory cell layers 340 remains disposed between insulator layers 210.

The radical oxidation process of step 303 may be performed in any suitable deposition chamber, such as the Decoupled Plasma Oxidation (DPO) reactors available from Applied Materials, Inc., of Santa Clara, Calif., or the like. The deposition chamber employed in step 302 may be a standalone chamber, or part of a cluster tool, such as one of a Gate Stack CENTURA®, available from Applied Materials, Inc., of Santa Clara, Calif.

Figure 4D:
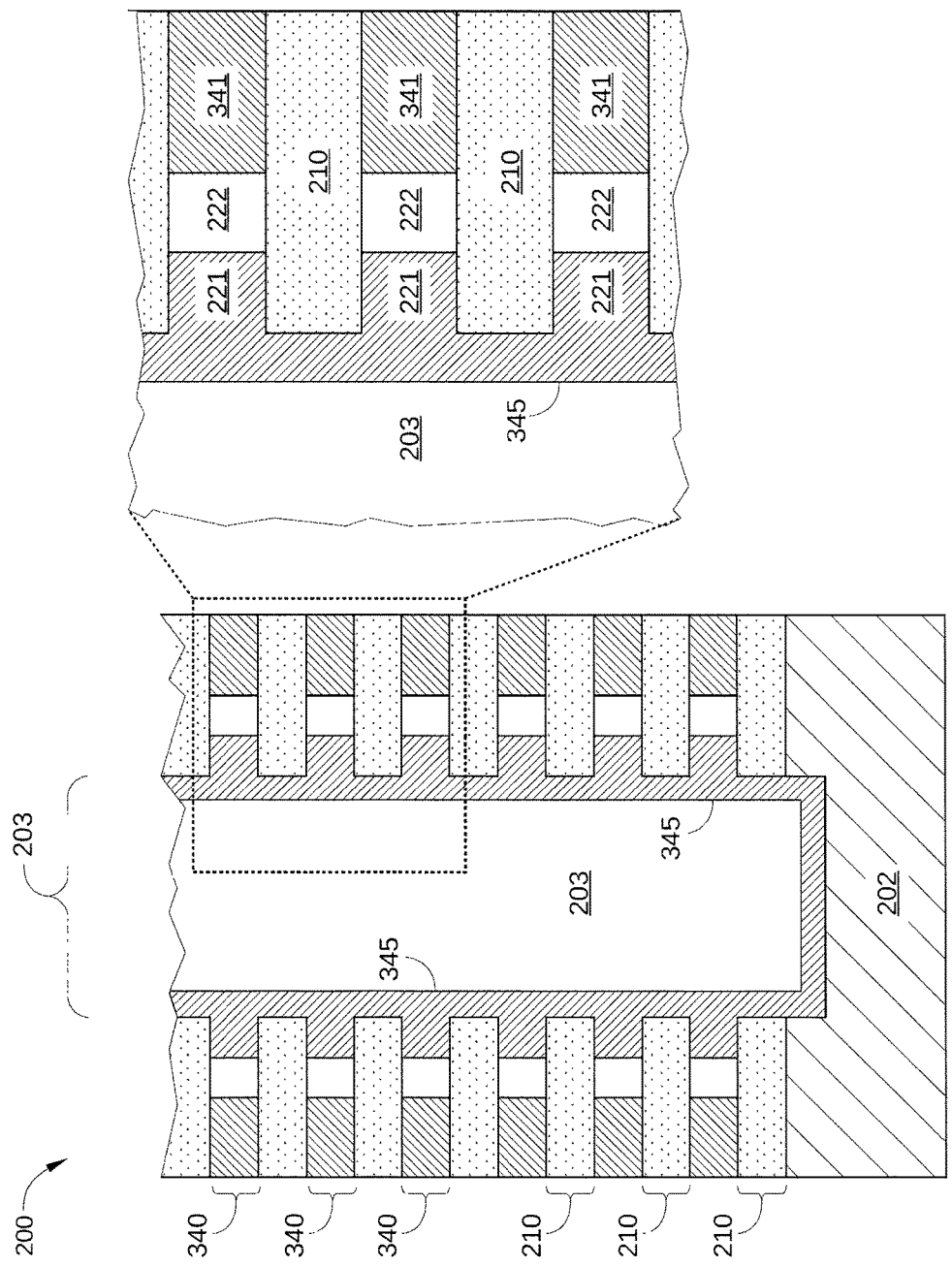

In step 304, a nitride deposition process is performed on exposed surfaces within memory hole 203 to form $Si_3N_4$ layer 345, as shown in FIG. 4D. Charge trap regions 221 of memory cells 220 are formed by this nitride deposition process when cavities 421 (shown in FIG. 4C) are filled with $Si_3N_4$ layer 345. Generally, any nitride deposition process suitable for filling cavities 421 in sacrificial memory cell layers 340 for each memory cell 220 may be employed in step 304.

Figure 4E:
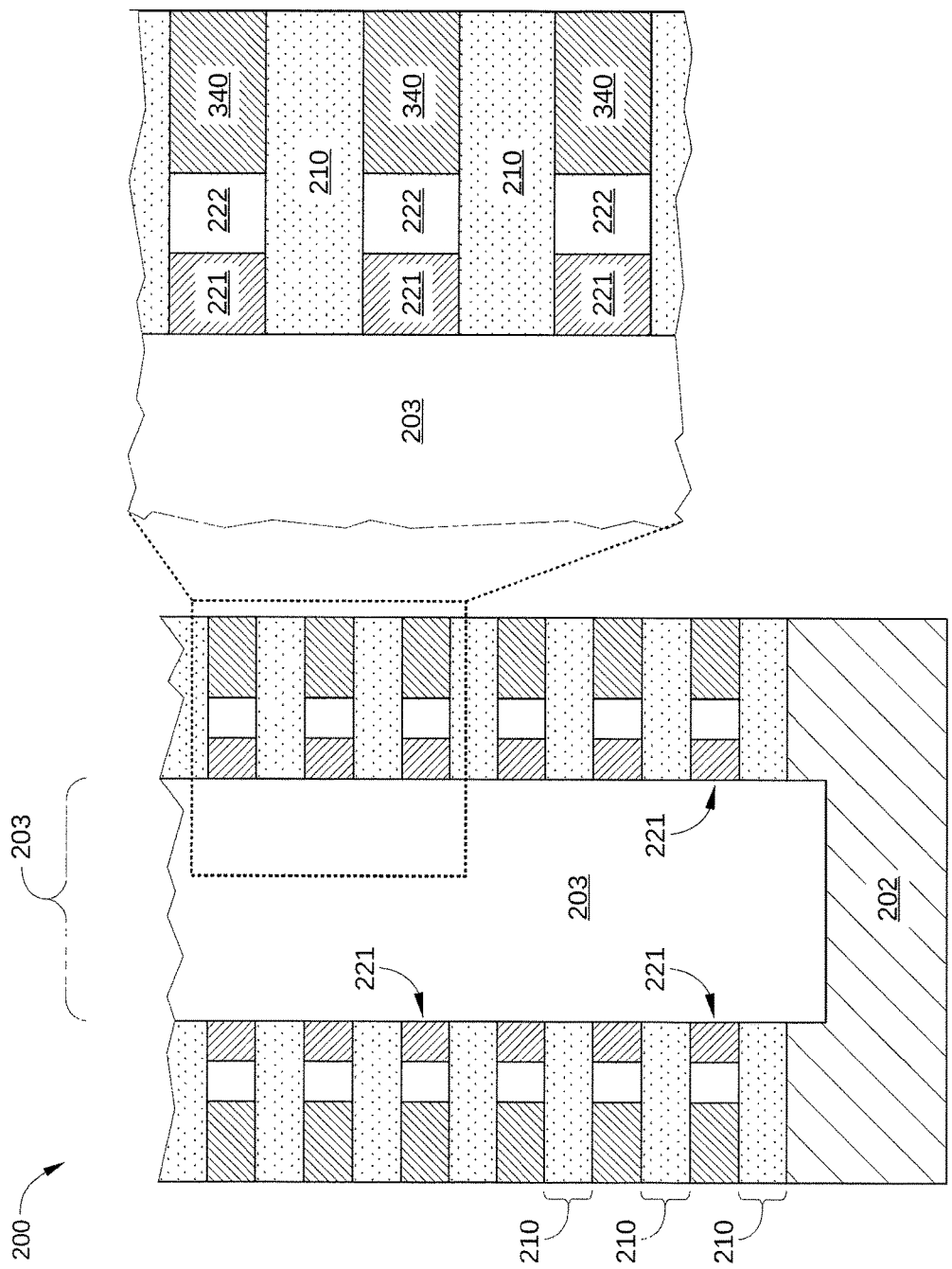

In step 305, a nitride removal process is performed to remove a portion of $Si_3N_4$ layer 345 and thereby separate charge trap regions 221 from each other, as shown in FIG. 4E. In some embodiments, the nitride removal process of step 305 may be substantially similar to the nitride etch process employed in step 302. In some embodiments, the nitride etch process of step 305 is modified with respect to the nitride etch process of step 302 to have a significantly slower etch rate and thereby provide finer thickness control. Upon completion of step 305, charge trap regions 221 are physically and electrically separated from each other.

Figure 4F:
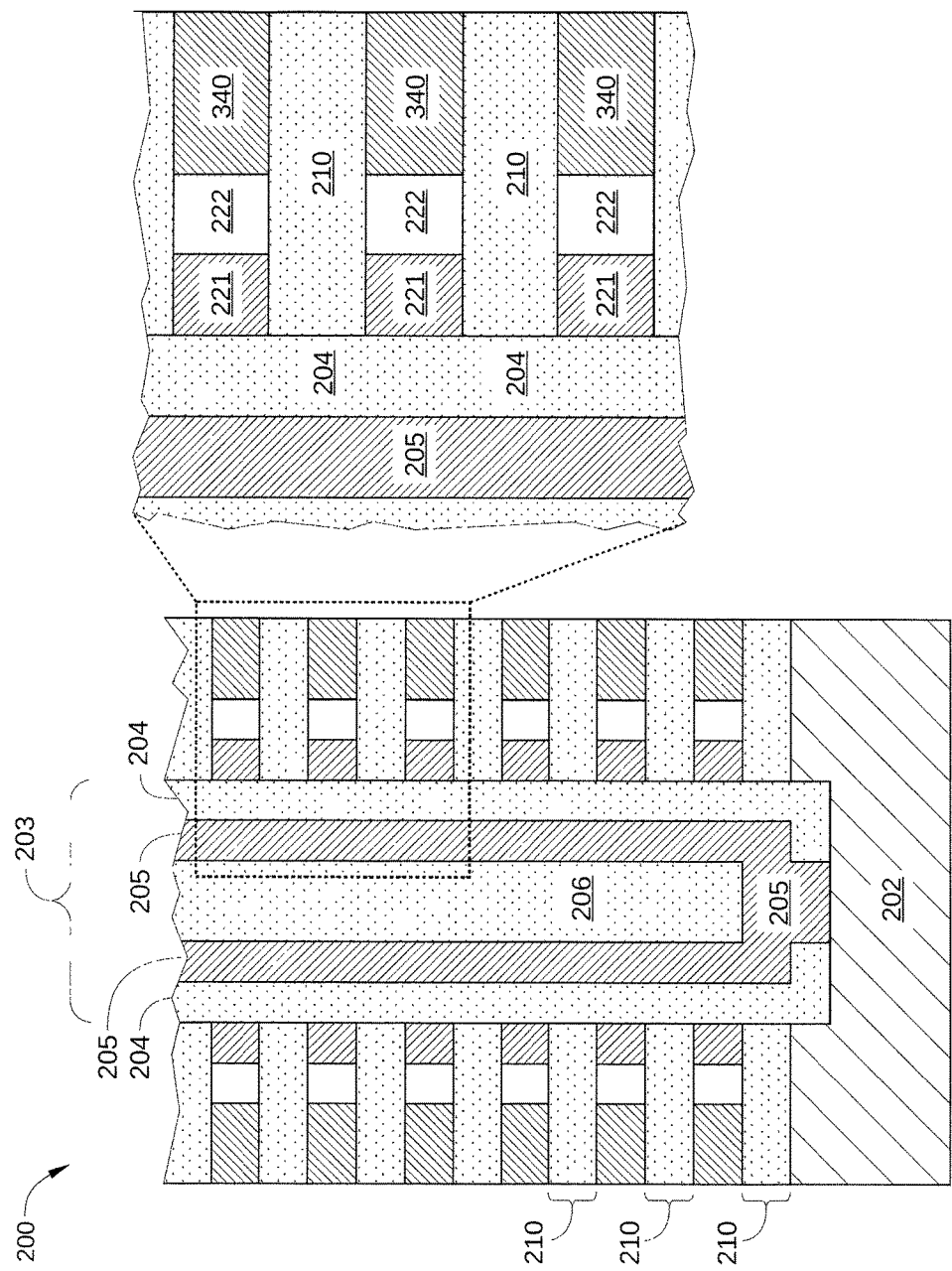

In step 306, a channel formation process is performed on exposed surfaces in memory hole 203. Thus, in some embodiments, gate oxide layer 204 is deposited on exposed surfaces of charge trap regions 221 and insulator layers 210, polysilicon channel 205 is deposited on exposed surfaces of gate oxide layer 204, and a remainder of memory hole 203 is filled with filler material 206, as shown in FIG. 4F. Conventional oxide deposition techniques may be employed to form gate oxide layer 204 and filler material 206, and conventional polysilicon deposition techniques may be employed to form polysilicon channel 205.

Figure 4G:
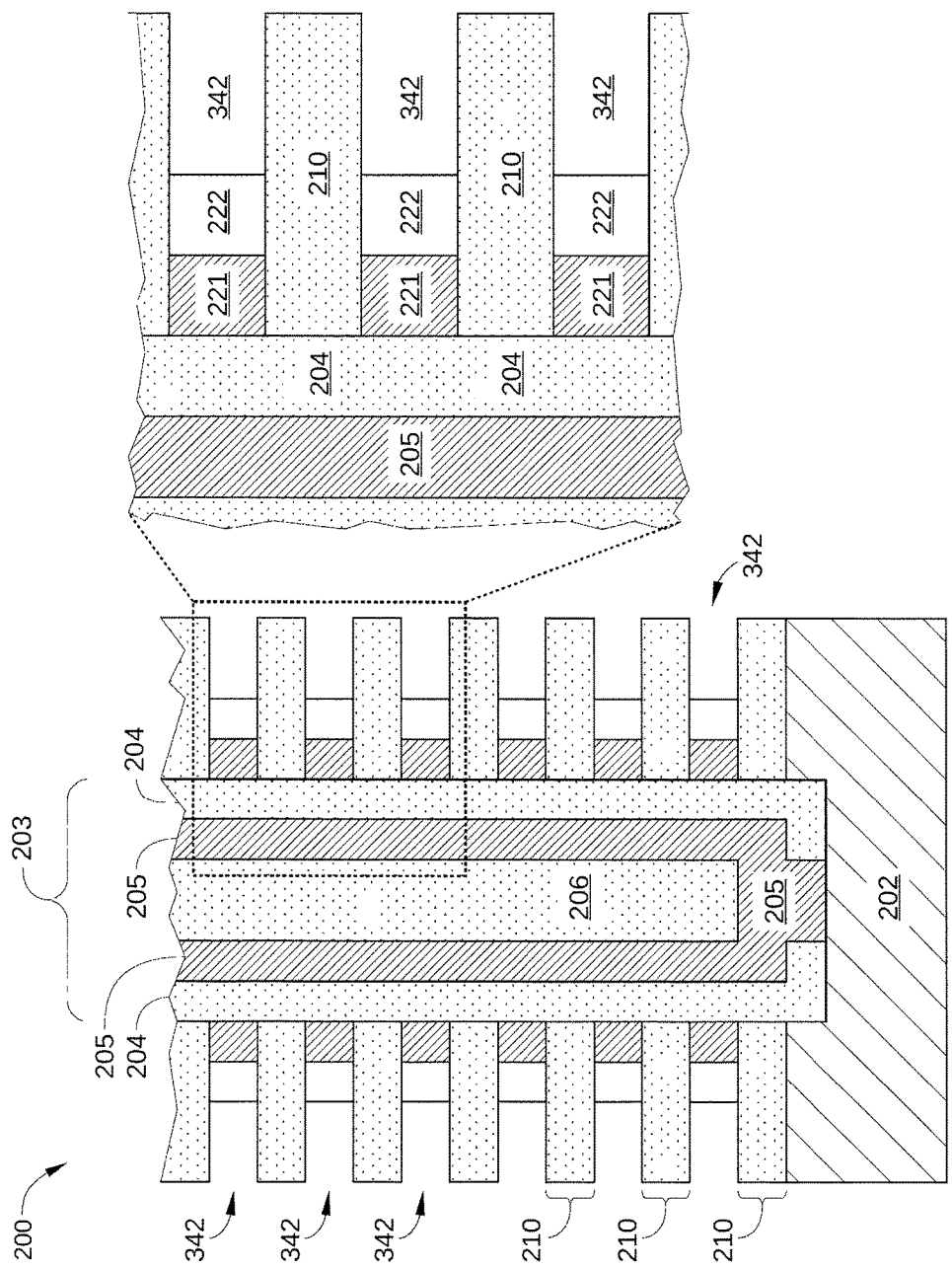

In step 307 a nitride strip process is performed on remainder portions 341 of sacrificial memory cell layers 340, as shown in FIG. 4G. In some embodiments, the nitride removal process of step 307 may be substantially similar to the nitride etch process employed in step 302. Upon completion of step 307, cavities 342 are formed between insulator layers 210. Cavities 342 are subsequently filled to form control gates 223 of memory cells 220.

Figure 4H:
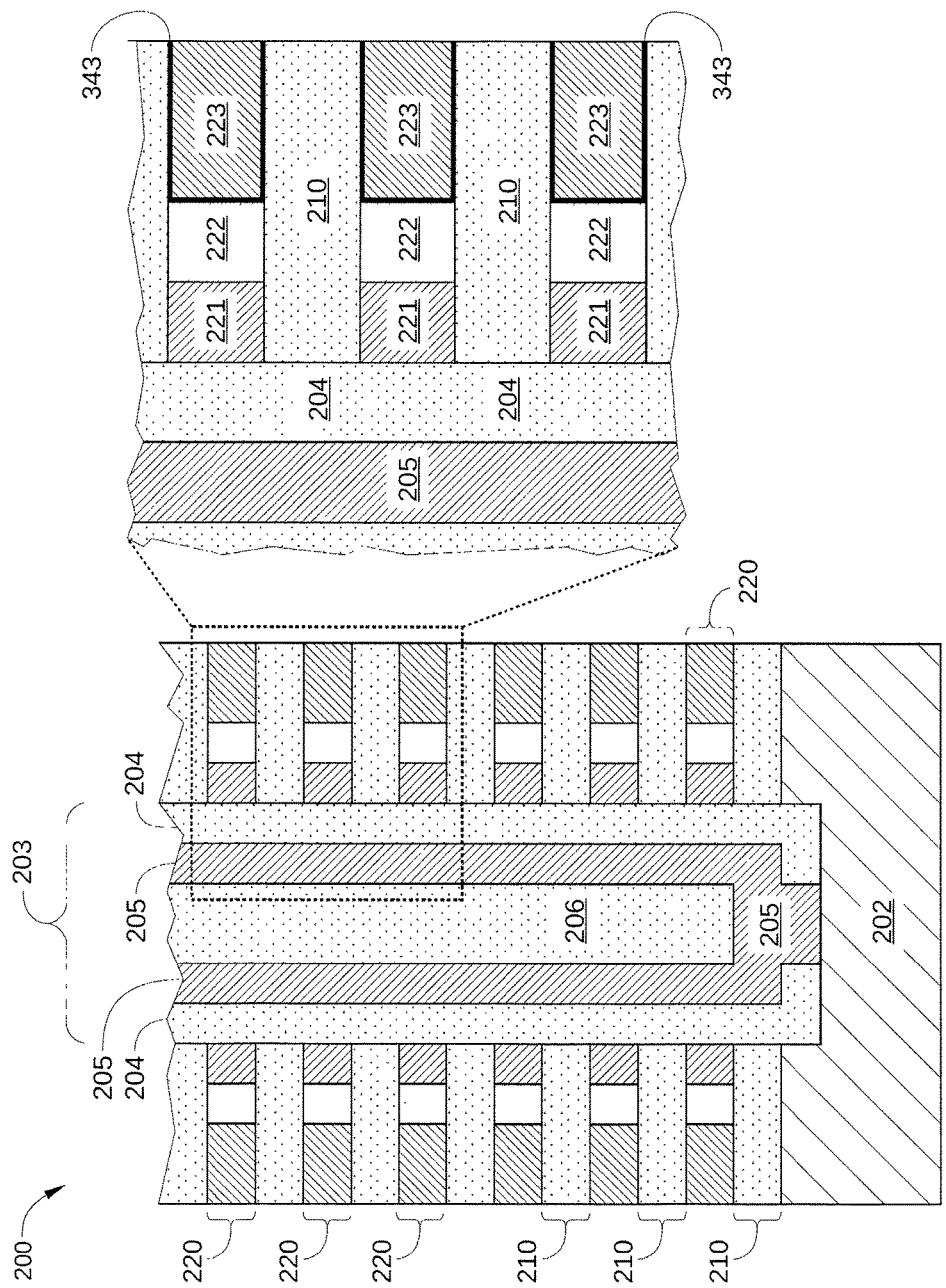

In step 308, control gates 223 are formed via a gate formation process, as shown in FIG. 4H. In some embodiments, in step 308 a high-k layer 343 is deposited on exposed surfaces of cavities 342 and insulator layers 210, control gates 223 are formed via a metal deposition process, for example via a chemical-vapor deposition (CVD) or atomic-layer deposition (ALD) process, and exposed portions of high-k layer 343 are etched from insulator layers 210. The high-k layer 343 may include an aluminum oxide ($AlO_x$), hafnium oxide ($HfO_x$) or other suitable high-k material, In addition, in some embodiments, a glue or barrier layer, such as a titanium nitride (TiN) layer (not shown for clarity) may be deposited in cavities 342 prior to the metal deposition process.

Upon completion of step 308, the charge trap region 221 of each memory cell 220 is physically and electrically separated from the charge trap region of adjacent memory cells 220 by insulator layers 210. Thus, the charge trap regions 221 of memory cells 220 are not susceptible to electron hopping or other leakage, and the word lines of 3D NAND memory device 200 are electrically isolated from each other.

Figure 4I:
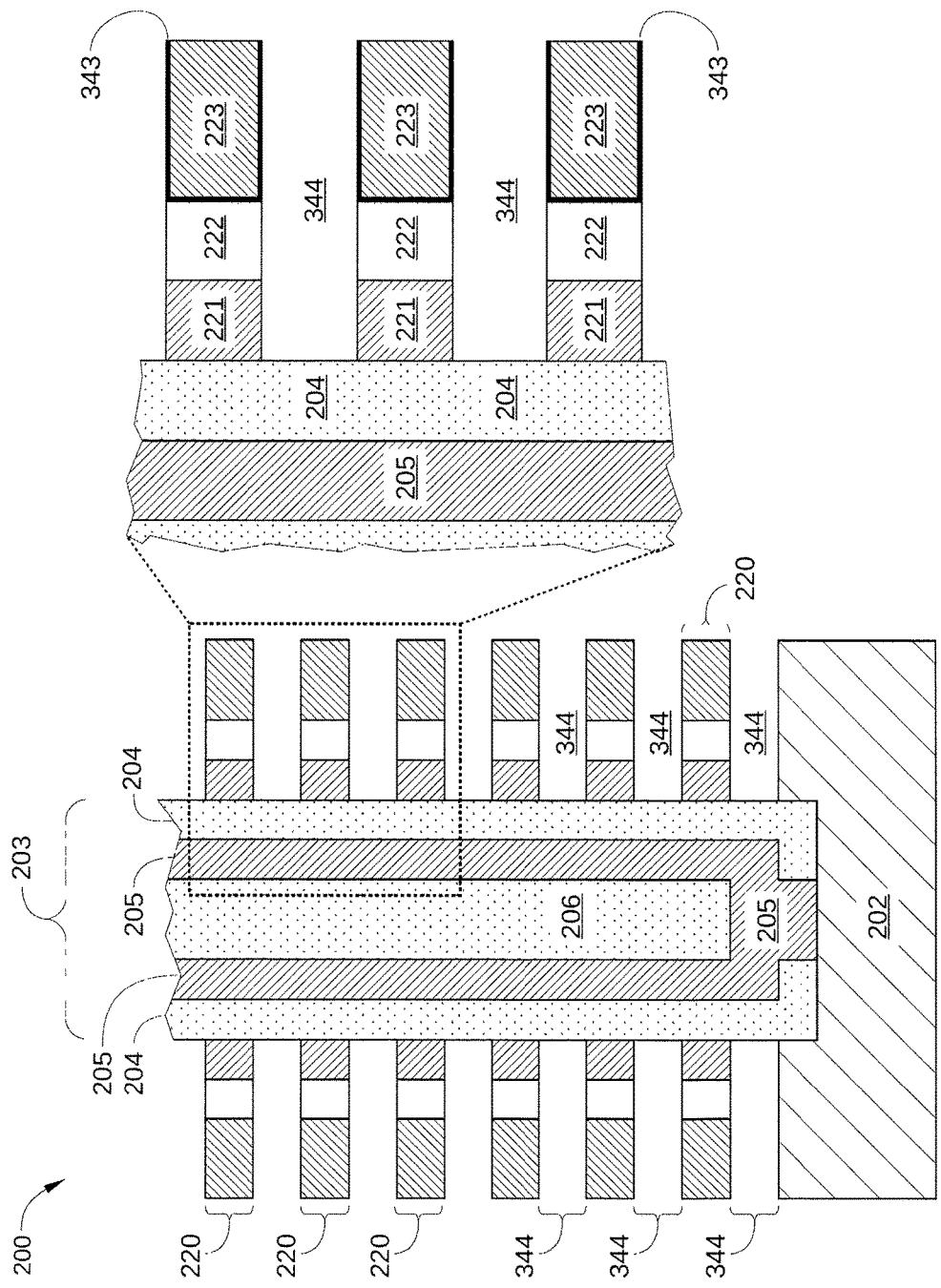

In some embodiments, as illustrated in FIG. 4I, in an optional step 309, some or all of insulator layers 210 are removed, so that the charge trap region 221 of each memory cell 220 is separated from the charge trap region of adjacent memory cells 220 by an "air gap" 344. It is noted that the term "air gap" may also refer any other gas-filled gap and/or to a vacuum containing gap. In such embodiments, the material of insulator layers 210 is selected to be suitable for use as a sacrificial oxide layer, and a suitable silicon oxide etch process can be employed in optional step 309.

Gate-First Memory Cell Fabrication

Figure 5:
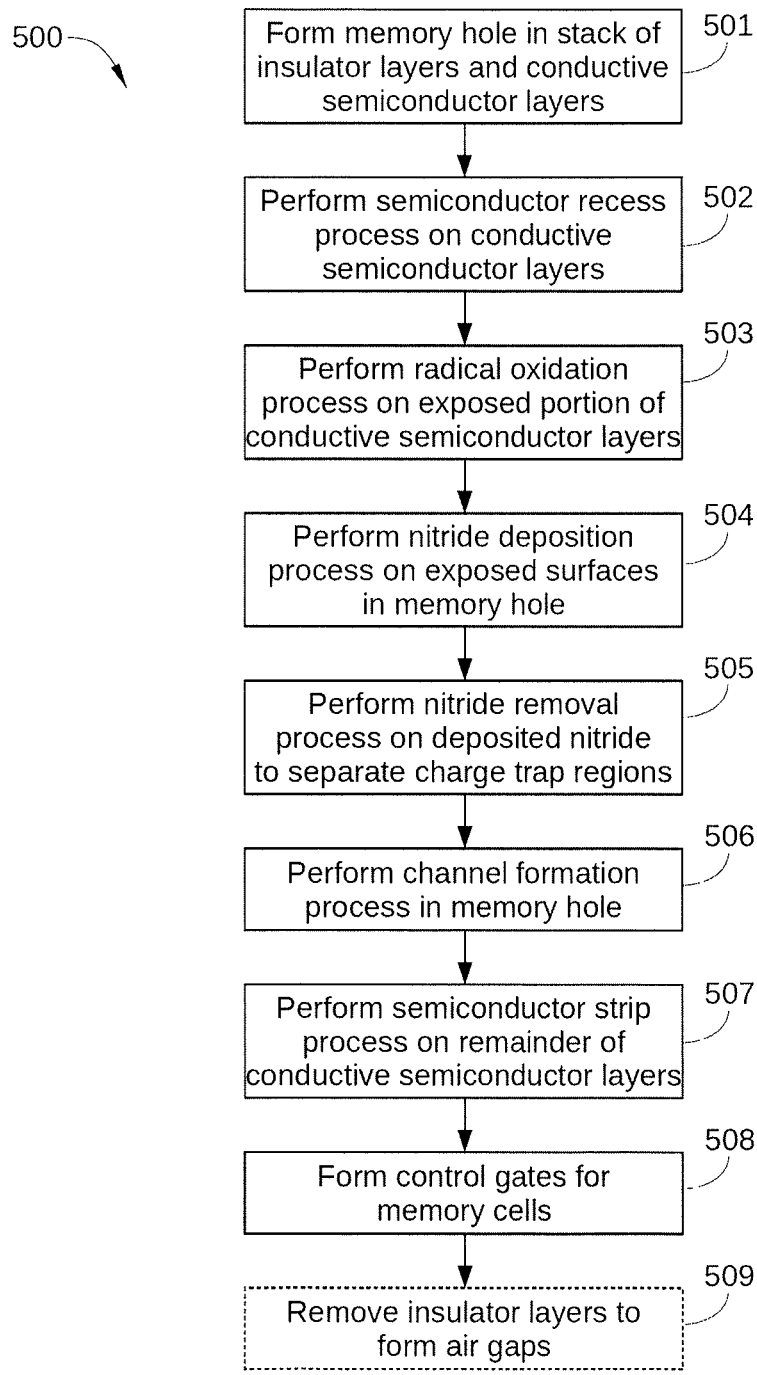
FIG. 5 sets forth a flow chart of process steps for forming memory cells in a 3D NAND memory device, according to various embodiments of the disclosure.

In some embodiments, a novel charge-trap region similar to charge trap region 221 may be formed via a "gate-first" fabrication process, in which at least a portion of the gate structure for each memory cell is formed from conductive material originally deposited between the insulator layers of the memory cell string. FIG. 5 sets forth a flow chart of process steps for forming memory cells in a 3D NAND memory device, according to various embodiments of the disclosure. FIGS. 6A-6I are schematic cross-sectional views of a 3D NAND memory device 600 corresponding to different stages of the process of FIG. 5, according to various embodiments of the disclosure.

Figure 6A:
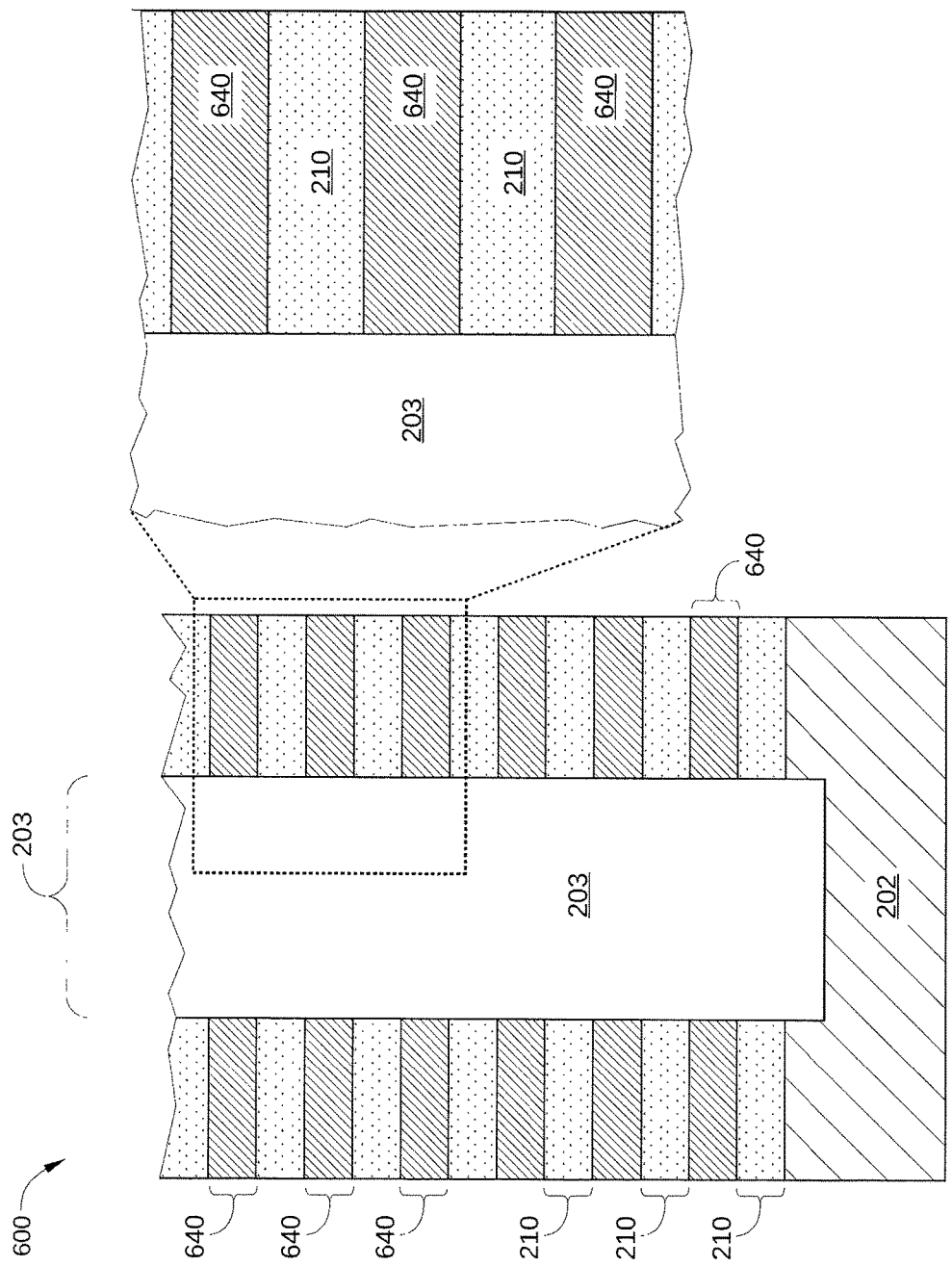
FIGS. 6A-6I are schematic cross-sectional views of a 3D NAND memory device corresponding to different stages of the process of FIG. 5, according to various embodiments of the disclosure.

Method 500 begins in step 501, in which memory hole 203 is formed in a stack of alternating insulator layers 210 and conductive semiconductor layers 640 in which memory hole 203 is formed. Alternating insulator layers 210 and conductive semiconductor layers 640 are deposited on semiconductor substrate 202, as shown in FIG. 6A. Conductive semiconductor layers 640 may include a doped or undoped polysilicon or any other conductive semiconductor material suitable for use as a control gate for a memory cell. Any suitable etching method may be employed to form memory hole 203, such as DRIE.

Figure 6B:
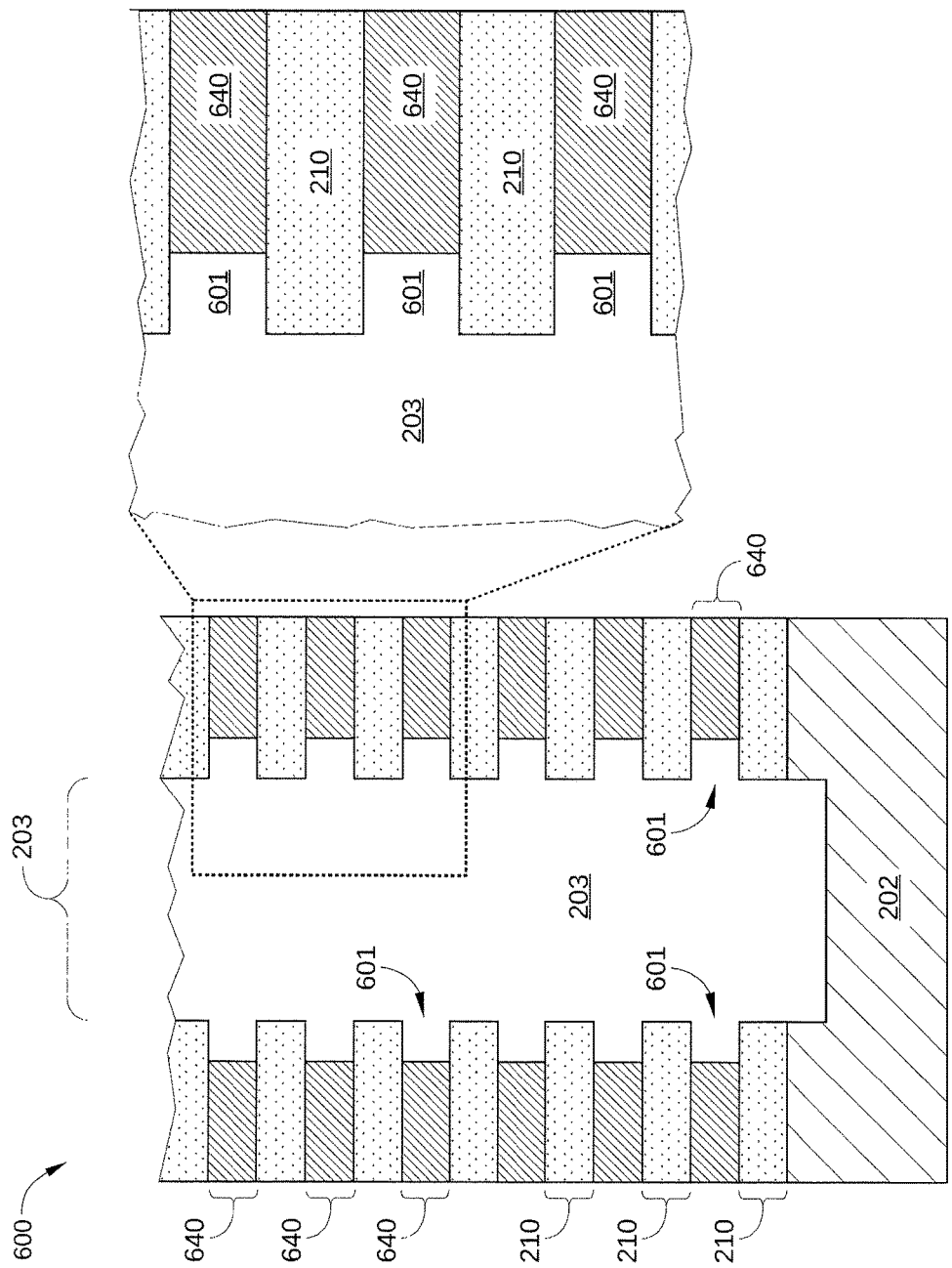

In step 502, a conductive semiconductor material recess process is performed to remove an exposed portion of conductive semiconductor layers 640 to form cavities 601, as shown in FIG. 6B. Generally any isotropic etch process that is selective to at least the material of insulator layers 210 may be employed in step 502. For example, in embodiments in which conductive semiconductor layers 640 include polysilicon and insulator layers 210 include silicon dioxide, a two-step, gas-phase etch process can be employed that first removes native oxide from the exposed portion of conductive semiconductor layers 640, then removes a portion of conductive semiconductor layer 640 to a targeted depth. More specifically, a first fluorine-containing precursor is flowed into a first remote plasma region while striking a plasma to form first plasma effluents from the fluorine-containing precursor. The first plasma effluents are are then flowed into a substrate processing region that houses semiconductor substrate 202, where the first plasma effluents react with any polysilicon native oxide formed on an exposed surface of conductive semiconductor layers 640. Without breaking vacuum, the semiconductor substrate 202 is transferred to a second substrate processing chamber included in the same substrate processing mainframe. A second fluorine-containing precursor is flowed into a second remote plasma region while striking a plasma to form second plasma effluents that flow through a showerhead into the second substrate processing region housing semiconductor substrate 202. The second plasma effluents react with the polysilicon layer of conductive semiconductor layers 640 to remove a portion thereof with high selectivity. Two-step, gas-phase etch processes suitable for use in step 502 are described in U.S. Patent Publication 2016/0042968, entitled "Integrated Oxide and Si Etch for 3D Cell Channel Mobility Improvements" and filed Aug. 5, 2014.

In one example of a two-step gas-phase etch process, semiconductor substrate 202 is transferred into a first substrate processing region within a first substrate processing chamber, and a flow of $NF_3$ is then introduced into a first remote plasma region where the $NF_3$ is excited in a remote plasma struck within the remote plasma region to etch a native oxide from conductive semiconductor layers 640. The remote plasma region is remote from and fluidly coupled to the first substrate processing region, and may be within a distinct module from the processing chamber, or may be a compartment within the processing chamber separated from the first substrate processing region by an aperture or a showerhead. In general, a fluorine-containing precursor may be flowed into the remote plasma region, and the fluorine-containing precursor comprises at least one precursor selected from the group consisting of atomic fluorine, diatomic fluorine, bromine trifluoride, chlorine trifluoride, nitrogen trifluoride, hydrogen fluoride, fluorinated hydrocarbons, sulfur hexafluoride and xenon difluoride.

According to embodiments, plasma effluents from the remote plasma region may pass through a showerhead and/or ion suppressor to reduce the electron temperature (to reduce the ion concentration) in the first substrate processing region. Reduced electron temperatures as described subsequently herein have been found to increase the etch selectivity of native silicon oxide compared to other exposed materials (e.g. polysilicon or silicon). In such embodiments, a hydrogen-containing precursor, e.g. ammonia ($NH_3$), may be simultaneously flowed into the first remote plasma region along with the $NF_3$ described previously. Generally speaking, the hydrogen-containing precursor may include one or more of atomic hydrogen, molecular hydrogen, ammonia, a hydrocarbon and an incompletely halogen-substituted hydrocarbon. The plasma effluents may enter the substrate processing region through through-holes in a showerhead or another style of aperture which separates the remote plasma region from the substrate processing region. When the plasma effluents formed in the remote plasma region are flowed into the first substrate processing region, native oxide formed on exposed surfaces of conductive semiconductor layers 640 is selectively etched. Thus, native silicon oxide is removed at a much higher rate than insulator layers 210 to expose silicon surfaces for further processing.

In the above-described process, energy may be applied to the fluorine-containing precursor while in the remote plasma region to generate the plasma effluents. As would be appreciated by one of ordinary skill in the art, the plasma may include a number of charged and neutral species including radicals and ions. The plasma may be generated using known techniques (e.g., radio frequency excitations, capacitively-coupled power or inductively coupled power). In an embodiment, the energy is applied using a capacitively-coupled plasma unit. The remote plasma source power may be between about 5 watts and about 5000 watts, between about 25 watts and about 1500 watts or between about 50 watts and about 1000 watts according to embodiments. The pressure in the remote plasma region may be such that the pressure in the first substrate processing region ends up between about 0.01 Torr and about 50 Torr or between about 0.1 Torr and about 5 Torr in embodiments. The capacitively-coupled plasma unit may be disposed remote from the first substrate processing region of the first substrate processing chamber. For example, the capacitively-coupled plasma unit and the plasma generation region may be separated from the gas reaction region by a showerhead.

Including a hydrogen-containing precursor with the fluorine-containing precursor in the first remote plasma region creates plasma effluents which produce solid etch by-products while etching native silicon oxide. The solid etch by-products form on the surface when the patterned substrate temperature is less than 80° C., less than 70° C., or less than 60° C., in embodiments. In this case, the solid etch by-products may be removed by sublimation effected by raising the patterned substrate temperature above 80° C., 90° C., or 100° C. according to embodiments. In order to remove the desired amount, the exposure to plasma effluents followed by sublimation may be repeated an integral number of times. The exposure to plasma effluents followed by sublimation may occur at least one, two, three, or four times, in embodiments. The remote plasma source power may be between about 0.5 watts and about 500 watts, between about 3 watts and about 150 watts or between about 10 watts and about 100 watts, according to embodiments.

Semiconductor substrate 202 is removed from first substrate processing region and placed in a second substrate processing region within a second substrate processing chamber affixed to the same substrate processing mainframe for performing the above-described native oxide removal process. An air-tight seal is maintained between the atmosphere outside the substrate processing mainframe and the interior of substrate processing mainframe at this time, thereby avoiding atmospheric exposure and preventing the formation of a native oxide like the one just removed.

Figure 8A:
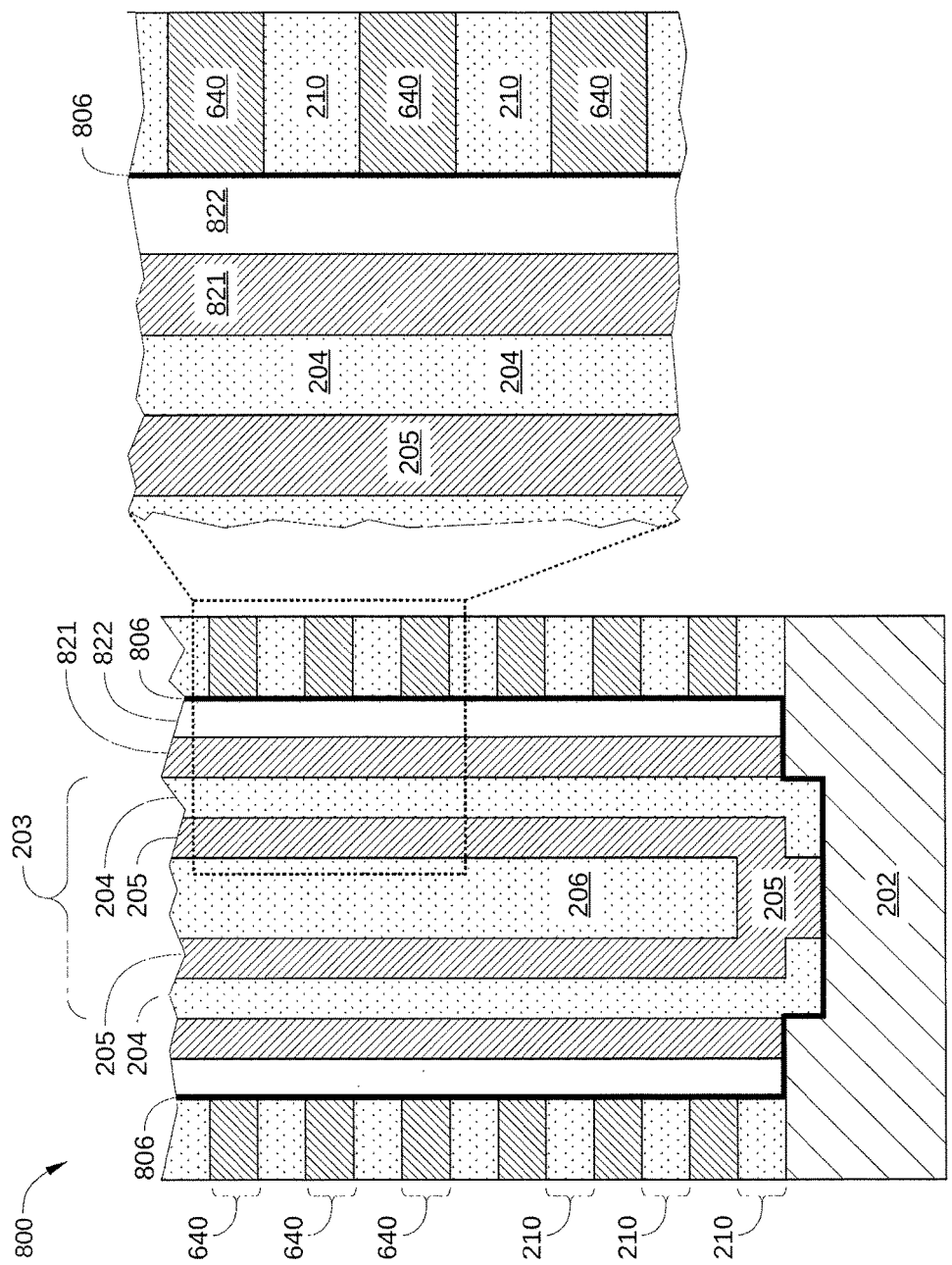
FIGS. 8A-8F are schematic cross-sectional views of a 3D NAND memory device corresponding to different stages of the process of FIG. 7, according to various embodiments of the disclosure.
Figure 8B:
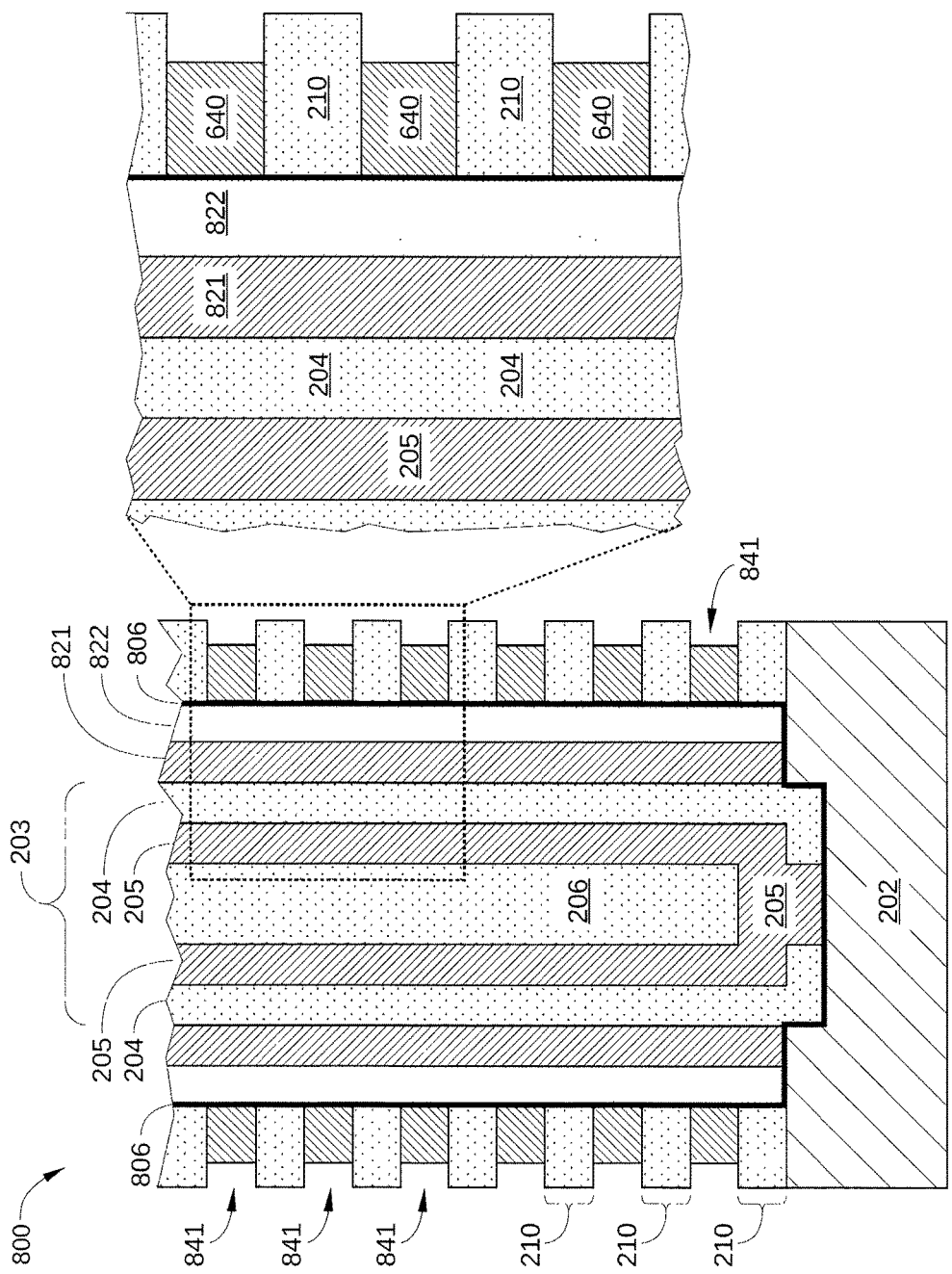

A flow of $NF_3$ is then introduced into a second remote plasma region inside the second substrate processing region where the $NF_3$ is excited in a remote plasma struck within the second remote plasma region. Remote plasma parameters may be similar to those for the above-described native oxide removal process. In general, a fluorine-containing precursor may be flowed into the second remote plasma region, where the fluorine-containing precursor comprises at least one precursor selected from the group consisting of atomic fluorine, diatomic fluorine, bromine trifluoride, chlorine trifluoride, nitrogen trifluoride, hydrogen fluoride, fluorinated hydrocarbons, sulfur hexafluoride and xenon difluoride. Plasma effluents are formed and passed into the second substrate processing region housing semiconductor substrate 202. Polysilicon is removed from conductive semiconductor layers 640 as shown in FIG. 8B. The second remote plasma region may be devoid or essentially devoid of hydrogen to achieve high selectivity of silicon and polysilicon relative to silicon oxide and silicon nitride. Independently or in combination with being hydrogen-free, the second remote plasma region may be devoid of oxygen, in some embodiments, to achieve the high selectivities of polysilicon relative to insulator layers 210. As before, the plasma effluents may pass through a showerhead and/or ion suppressor to reduce the electron temperature (to reduce the ion concentration) in the second substrate processing region. Reduced electron temperatures as described subsequently herein have been found to increase the etch selectivity of silicon and polysilicon relative to other exposed materials.

Figure 6C:
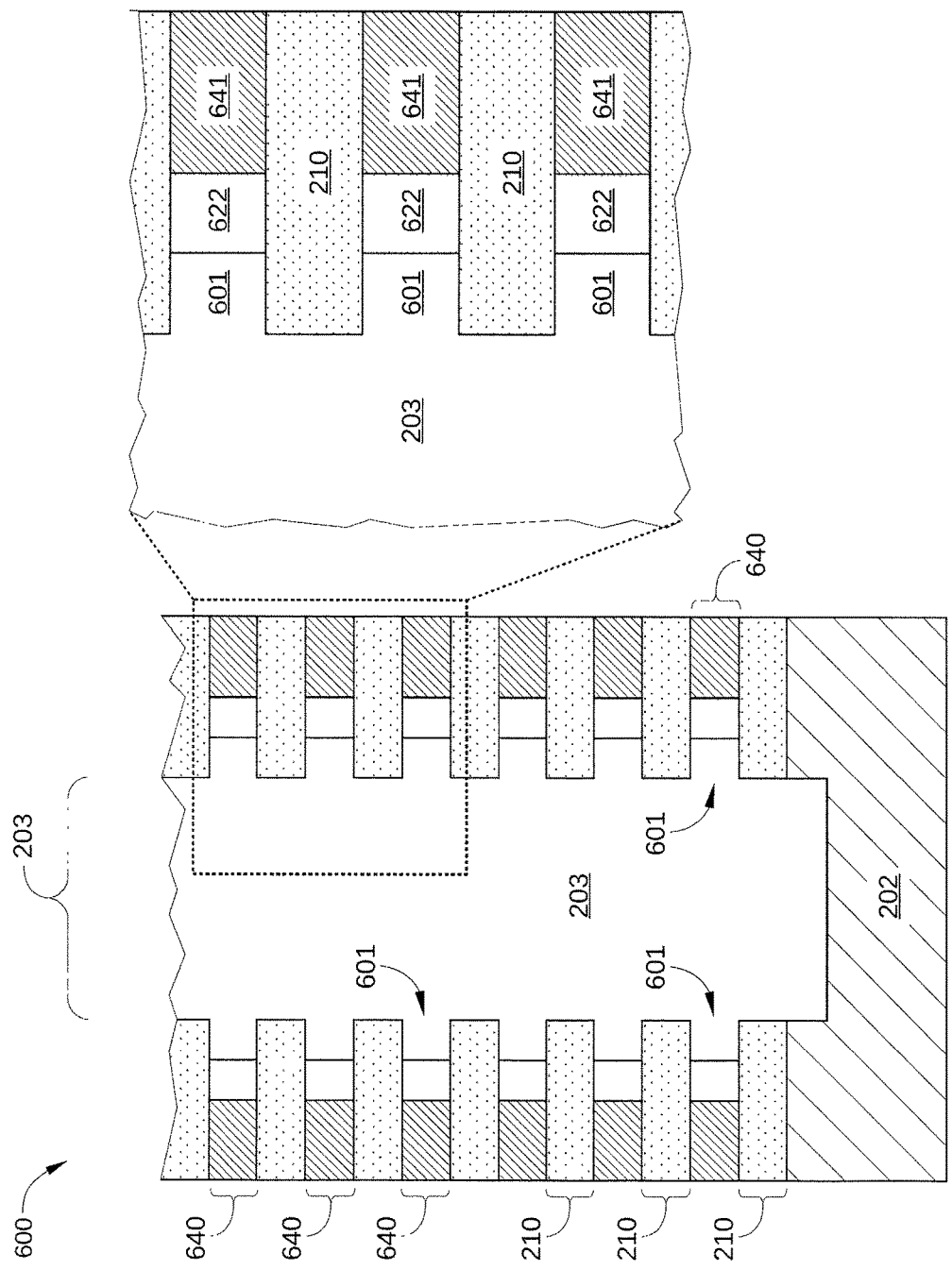
Figure 6D:
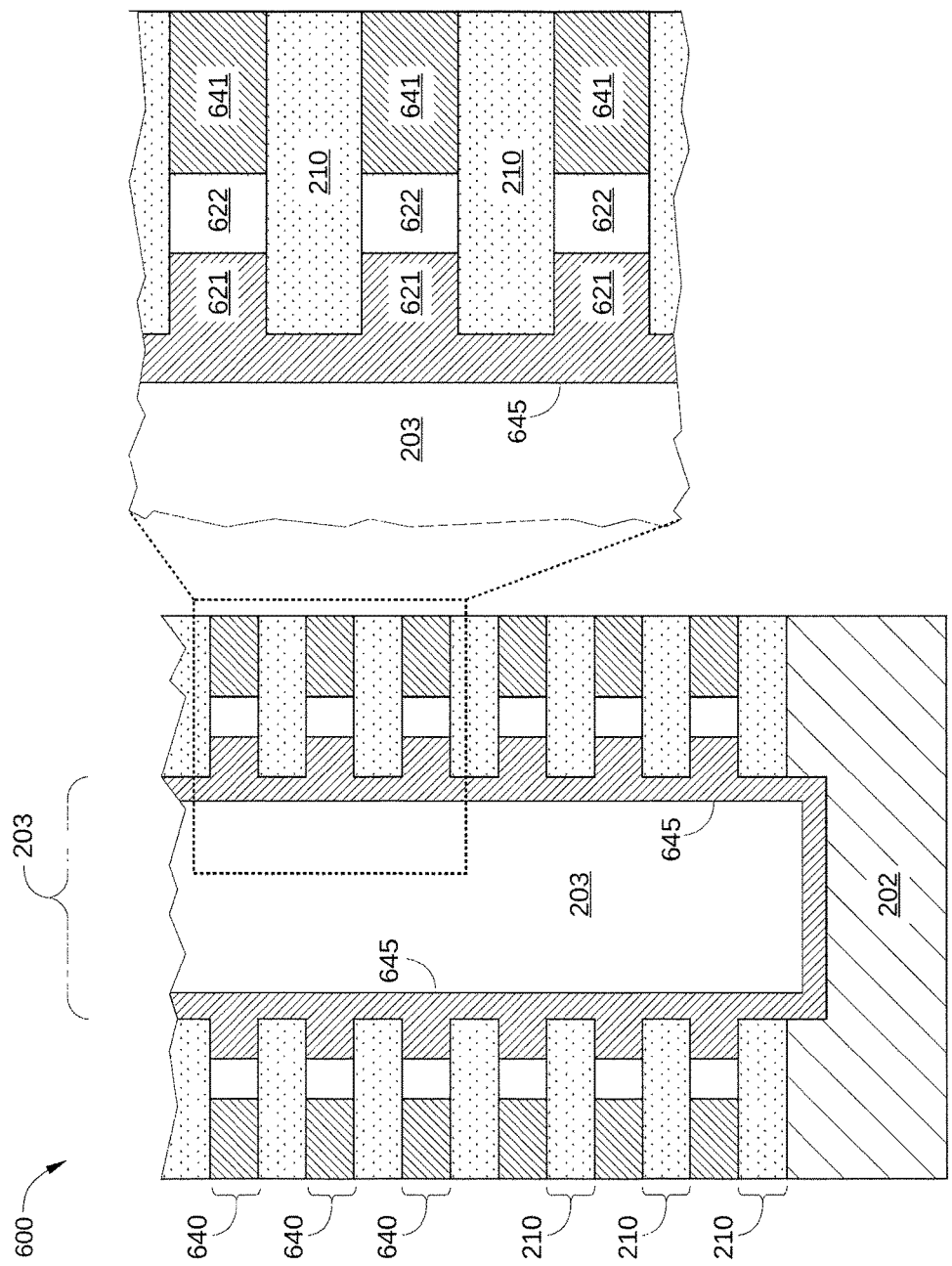

Generally, the quantity of conductive semiconductor layers 640 removed in step 502 is sufficient for the subsequent formation of isolated charge trap regions 621, shown in FIG. 6D. Thus cavities 601 formed between insulator layers 210 in step 502 have substantially the same size as the subsequently formed charge trap regions 621.

In step 503, a radical oxidation process is performed to form blocking oxides 222 by oxidizing an exposed portion of conductive semiconductor layers 640, as shown in FIG. 6C. The isotropic oxidation process of step 503 may be substantially similar to the radical oxidation process employed in step 303 of method 3, except with a chemistry modified to form a suitable oxide from the material of conductive semiconductor layers 640. Upon completion of step 503, a portion of conductive semiconductor layers 640 is converted to blocking oxide 622 and a remainder portion 641 remains disposed between insulator layers 210.

In step 504, a nitride deposition process is performed on exposed surfaces within memory hole 203, as shown in FIG. 6D. Charge trap regions 621 of memory cells 620 are formed by this nitride deposition process when cavities 601 (shown in FIG. 6C) are filled with $Si_3N_4$ layer 645. Generally, any nitride deposition process suitable for filling cavities 601 in conductive semiconductor layers 640 for each memory cell 620 may be employed in step 504. For example, in some embodiments, a process is employed in step 504 that is similar to the nitride deposition process of step 304 in method 300.

Figure 6E:
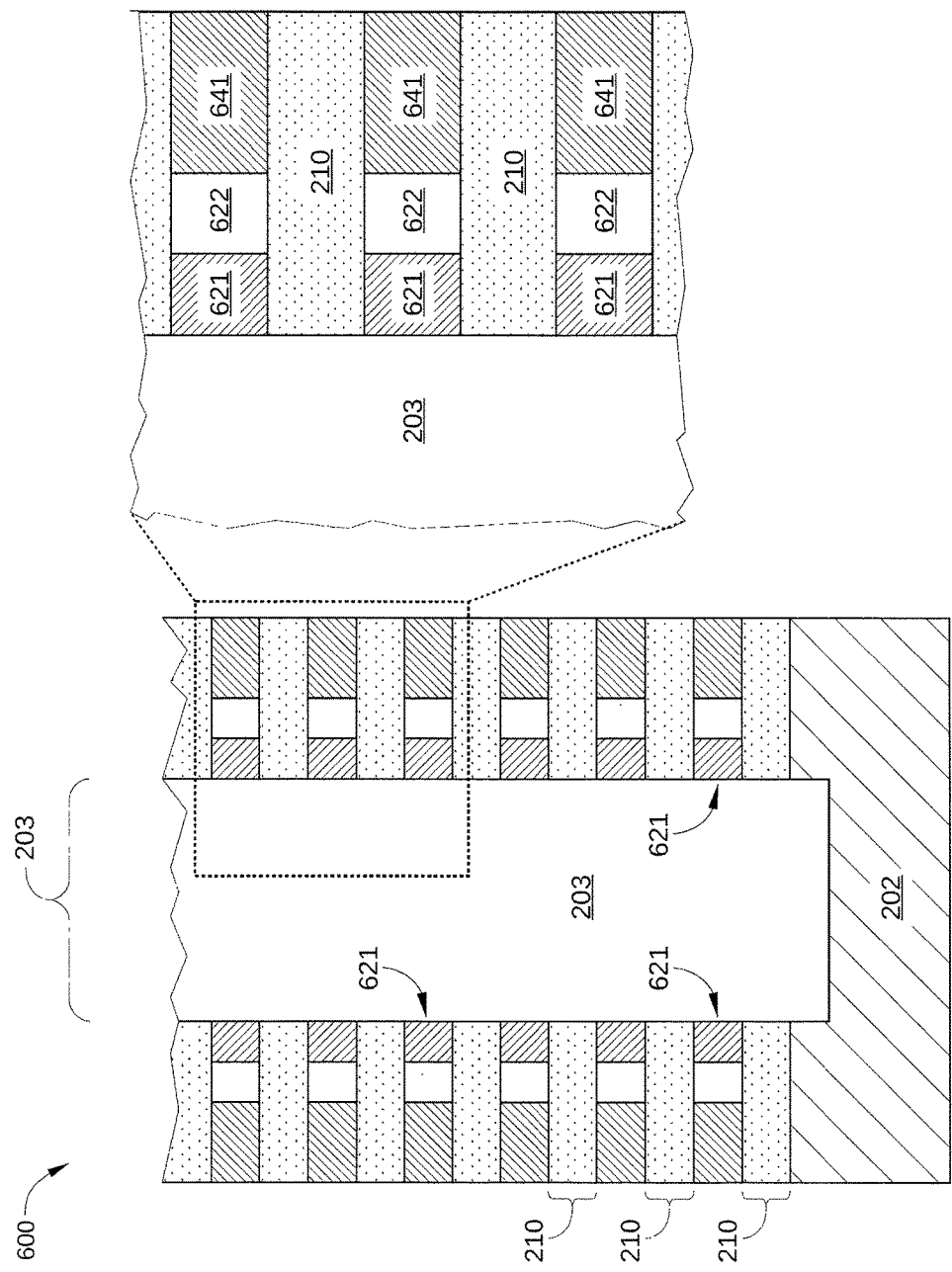

In step 505, a nitride removal process is performed to separate charge trap regions 621 from each other, as shown in FIG. 6E. In some embodiments, the nitride removal process of step 505 may be substantially similar to the nitride etch process employed in step 502, except that only a portion of $Si_3N_4$ layer 645 is removed. Specifically, sufficient material from $Si_3N_4$ layer 645 is removed in step 505 so that charge trap regions 621 are physically separated from each other, as shown in FIG. 6E. For example, in step 505, 10 nm to 25 nm may be removed from $Si_3N_4$ layer 645. In some embodiments, the nitride etch process of step 505 is modified with respect to the nitride etch process of step 502 to have a significantly slower etch rate and thereby provide finer thickness control. Upon completion of step 505, charge trap regions 621 are physically and electrically separated from each other.

Figure 6F:
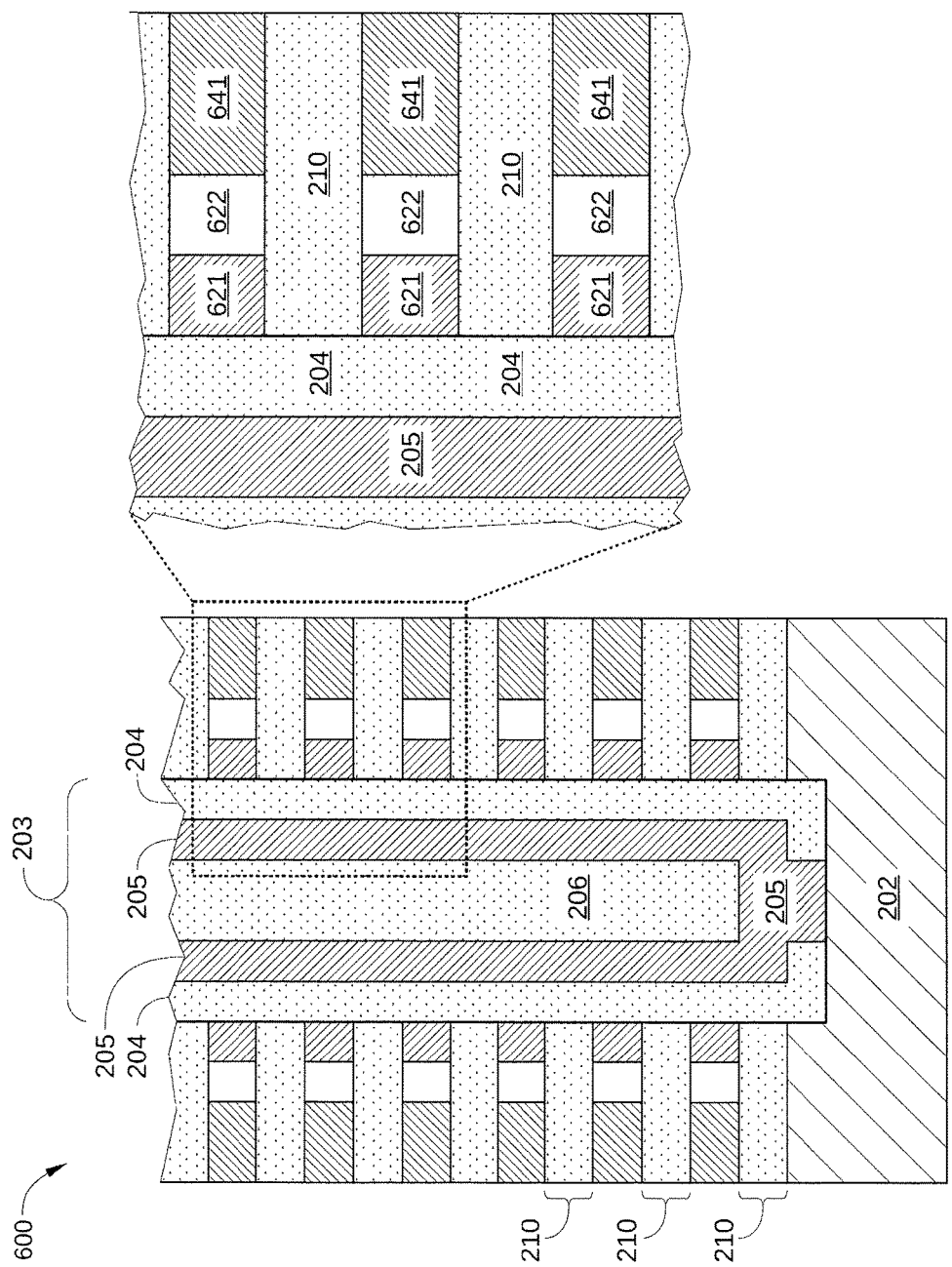

In step 506, a channel formation process is performed. In the channel formation process of step 506, gate oxide layer 204 is deposited on exposed surfaces of charge trap regions 621 and insulator layers 210, polysilicon channel 205 is deposited on gate oxide layer 204, and a remainder of memory hole 203 is filled with filler material 206, as shown in FIG. 6F. In some embodiments, the channel formation processes of step 506 may be substantially similar to the channel formation process employed in step 306 of method 300.

Figure 6G:
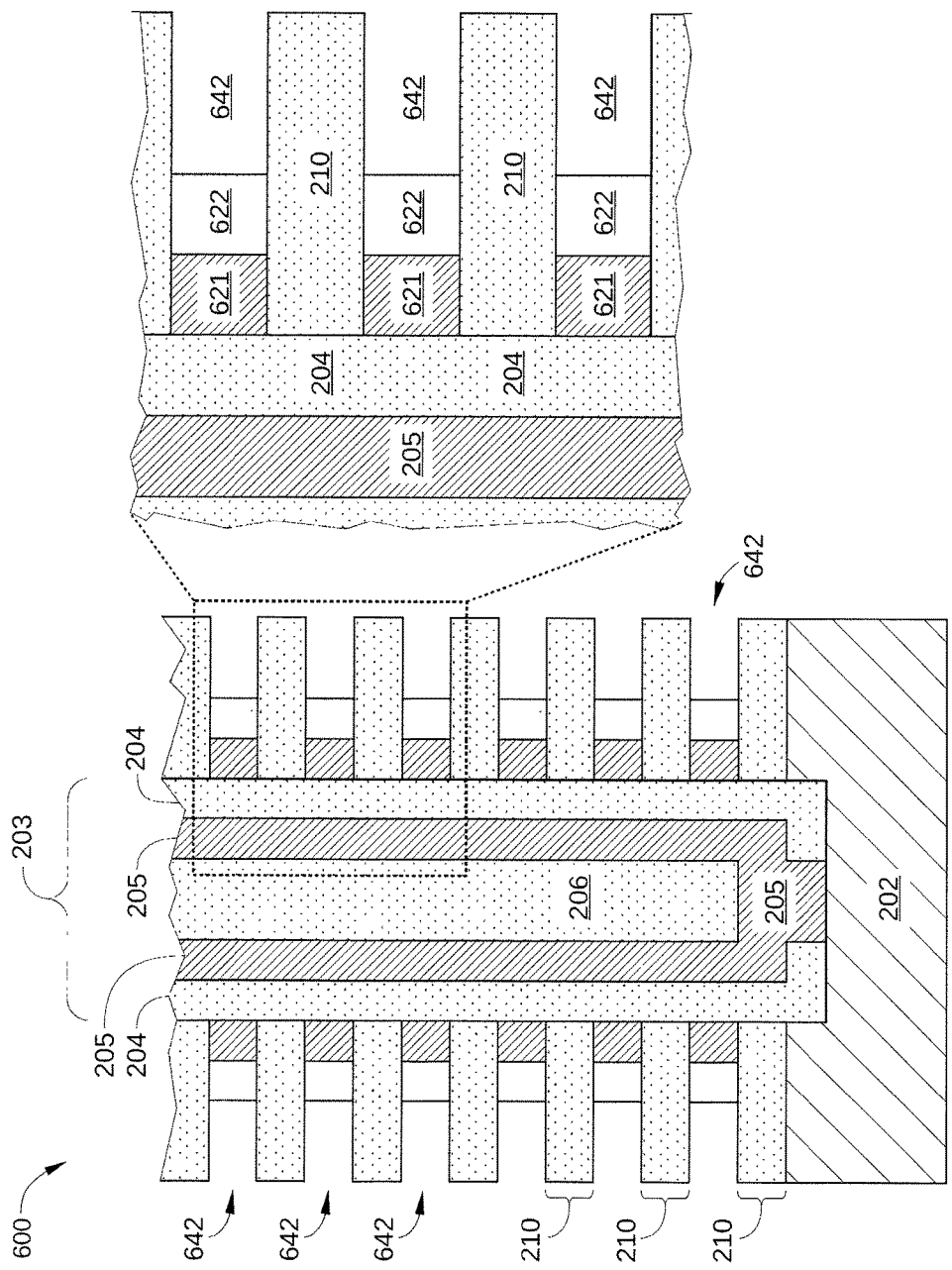

In step 507 a conductive semiconductor strip process is performed on remainder portions 641 of conductive semiconductor layers 640, as shown in FIG. 6G. In some embodiments, the conductive semiconductor strip process of step 507 may be substantially similar to the conductive semiconductor strip process employed in step 502. Upon completion of step 507, cavities 642 are formed between insulator layers 210. Cavities 642 are subsequently filled to form control gates 623 of memory cells 620.

Figure 6H:
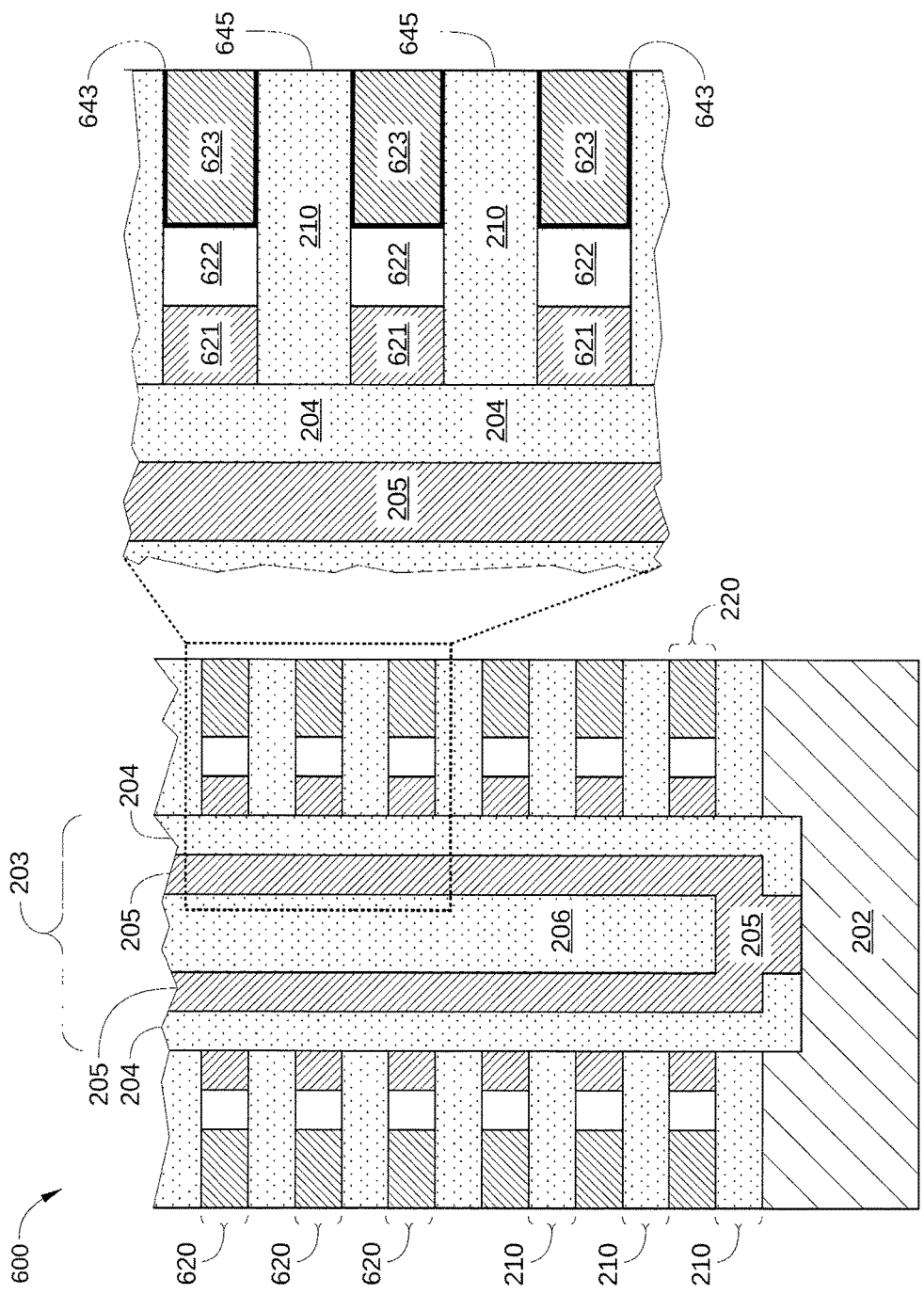

In step 508, control gates 623 are formed via a gate formation process, as shown in FIG. 6H. In some embodiments, in step 508 a conformal tungsten (W) layer is deposited on exposed surfaces of cavities 642 and insulator layers 210, for example via a CVD or atomic-layer deposition ALD process, and the conformal W layer is etched back to again expose surfaces 645 of insulator layers 210 and electrically separate the now formed control gates 623. In some embodiments, a glue or barrier layer, such as a titanium nitride (TiN) layer 643 is deposited in cavities 542 prior to the deposition of conformal W layer.

Figure 6I:
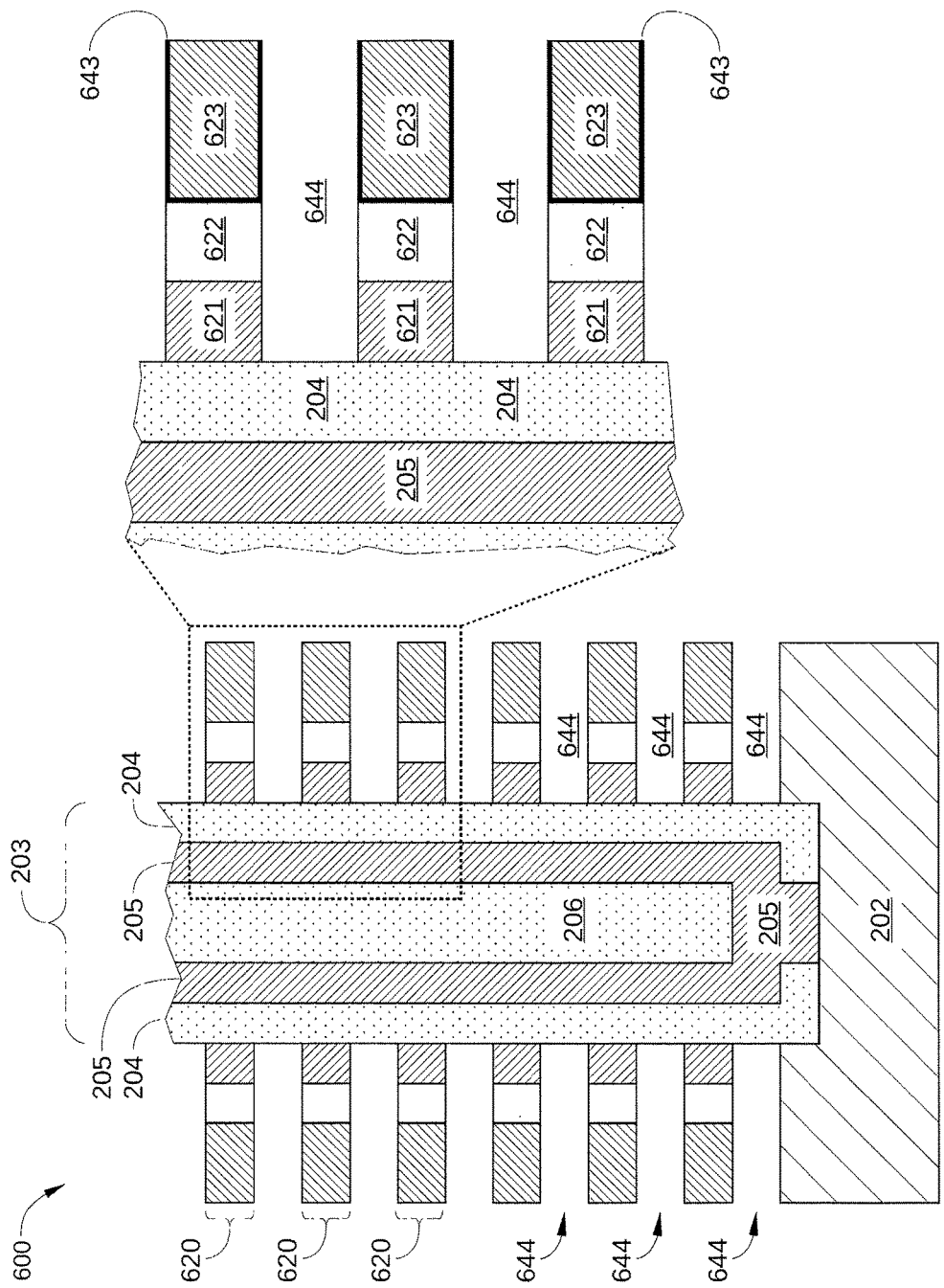

In some embodiments, in an optional step 509, some or all of insulator layers 210 are removed, so that each of memory cells 620 is separated from adjacent memory cells 620 by an air gap 644, as shown in FIG. 6I. In such embodiments, the material of insulator layers 210 is selected to be suitable for use as a sacrificial oxide layer, and a suitable silicon oxide etch process can be employed in optional step 509.

Alternative Gate-First Memory Cell Fabrication

Figure 7:
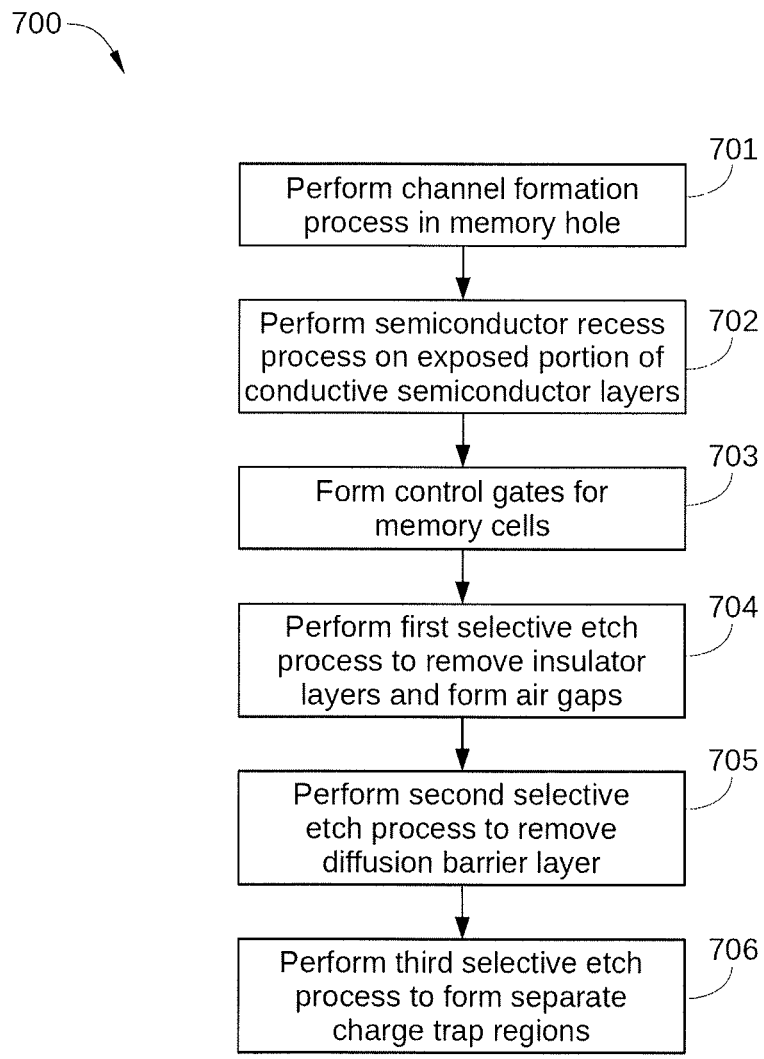
FIG. 7 is a flow chart of process steps for forming memory cells in a 3D NAND memory device, according to various embodiments of the disclosure.

In alternative embodiments, a novel charge-trap region similar to charge trap region 221 in FIG. 2 may be formed via a different gate-first fabrication process described below in conjunction with FIG. 7. FIG. 7 is a flow chart of process steps for forming memory cells in a 3D NAND memory device, according to various embodiments of the disclosure. FIGS. 8A-8F are schematic cross-sectional views of a 3D NAND memory device 800 corresponding to different stages of the process of FIG. 7, according to various embodiments of the disclosure.

Method 700 begins in step 701, in which a channel formation process is performed on a stack of alternating insulator layers 210 and conductive semiconductor layers 640 in which memory hole 203 is formed. In some embodiments, the memory hole 203 may have a slight difference in its shape and/or size when compared to the memory hole 203 shown in FIG. 4A or FIG. 6A. Alternating insulator layers 210 and conductive semiconductor layers 640 are deposited on semiconductor substrate 202, as shown in FIG. 8A.

In the channel formation process of step 701, a diffusion barrier layer 806 is deposited on inner surfaces of memory hole 203, a block oxide layer 822 is deposited on diffusion barrier layer 806, a charge trap layer 821 is deposited on block oxide layer 822, gate oxide layer 204 is deposited on charge trap layer 821, polysilicon channel 205 is deposited on gate oxide layer 204, and a remainder of memory hole 203 is filled with filler material 206. Conventional deposition techniques may be employed to form diffusion barrier layer 806, block oxide layer 822, charge trap layer 821, gate oxide layer 204, polysilicon channel 205, and filler material 206. The diffusion barrier layer 806 may include aluminum oxide (AlOx), titanium nitride (TiN), or other suitable material. The block oxide layer 822 may include a layer that is configured to prevent or reduce the diffusion of metal atoms from control gate into gate oxide, such as a silicon oxide ($SiO_x$) material or other useful material. The charge trap layer 821 may include a silicon nitride ($Si_3N_4$) material.

In step 702, a conductive semiconductor material recess process is performed to remove an exposed portion of conductive semiconductor layers 640, as shown in FIG. 8B. Generally any isotropic etch process that is selective to at least the material of insulator layers 210 may be employed in step 702. For example, in embodiments in which conductive semiconductor layers 640 include polysilicon and insulator layers 210 include silicon dioxide, a wet etch process can be employed in step 702 that includes $HNO_3$ and hydrofluoric acid HF to selectively remove a portion of conductive semiconductor layers 640. The quantity of material removed from conductive semiconductor layers 640 is sufficient for the subsequent formation of isolated charge trap regions 829, shown in FIG. 8F. Thus the cavities 841 formed between insulator layers 210 in step 702 have substantially the same size as the subsequently formed charge trap regions 829.

Figure 8C:
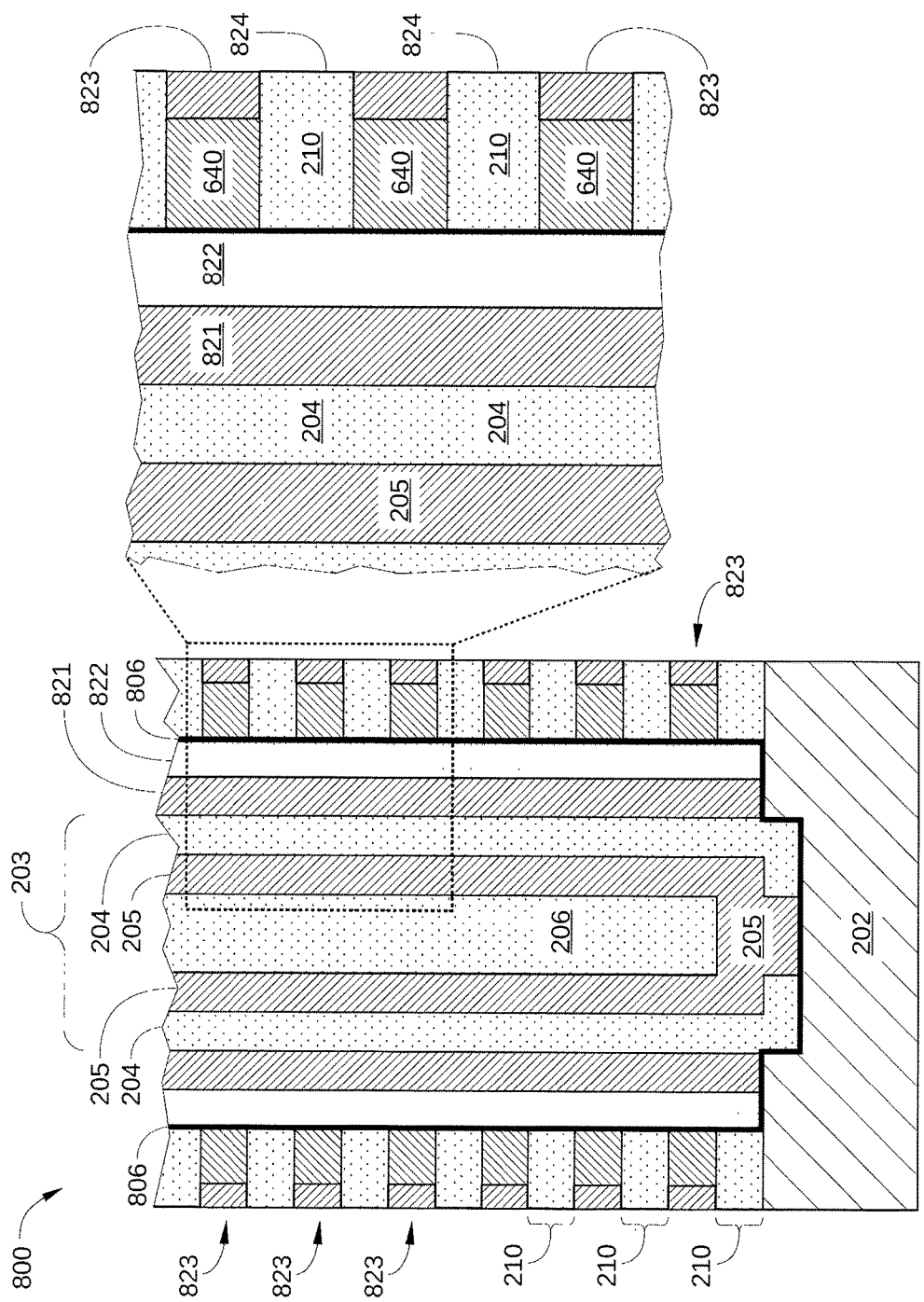

In step 703, control gates 823 are formed via a gate formation process, as shown in FIG. 8C. In some embodiments, in step 308 a high-k layer (not shown) is deposited on exposed surfaces of cavities 841 and insulator layers 210. Control gates 823 are then formed via a metal deposition process, for example via a chemical-vapor deposition (CVD) or atomic-layer deposition (ALD) process. Edge surfaces 824 of insulator layers 210 are again exposed by the removal of portions of the deposited metal and/or high-k layer that are disposed outside of cavities 841, for example via a DRIE or other anisotropic dry etch process.

Figure 8D:
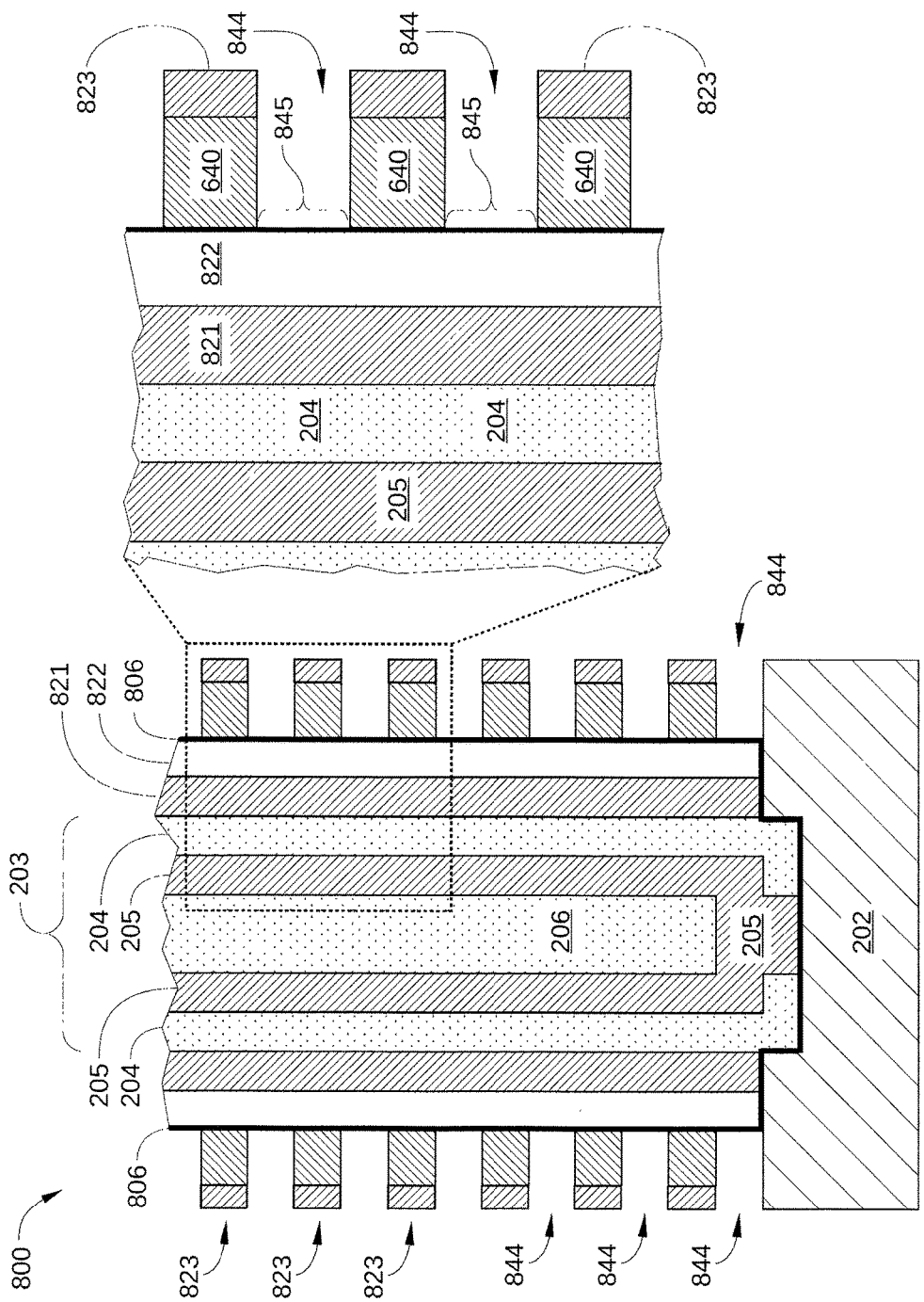

In step 704, a selective etch process is performed, so that some or all of insulator layers 210 are removed and each of memory cells 820 is separated by an air gap 844, as shown in FIG. 8D. In such embodiments, the material of insulator layers 210 is selected to be suitable for use as a sacrificial oxide layer. Any conventional silicon oxide removal process may be employed in step 704 that is selective to the material included in conductive semiconductor layers 640 and control gates 823. It is noted that upon completion of step 704, portions 845 of diffusion barrier layer 806, which in some embodiments is an aluminum dioxide ($Al_2O_3$) layer, are exposed to air gaps 844. Thus, in some embodiments, the etch process employed in step 704 is highly selective to the material of diffusion barrier layer 806 (such as AlOx and/or TiN). One gas-phase etch process that etches silicon oxide with sufficiently high selectivity and is suitable for use in step 704 is described in U.S. Patent Publication 2016/0042968, entitled "INTEGRATED OXIDE AND SI ETCH FOR 3D CELL CHANNEL MOBILITY IMPROVEMENTS" and filed Aug. 5, 2014.

Figure 8E:
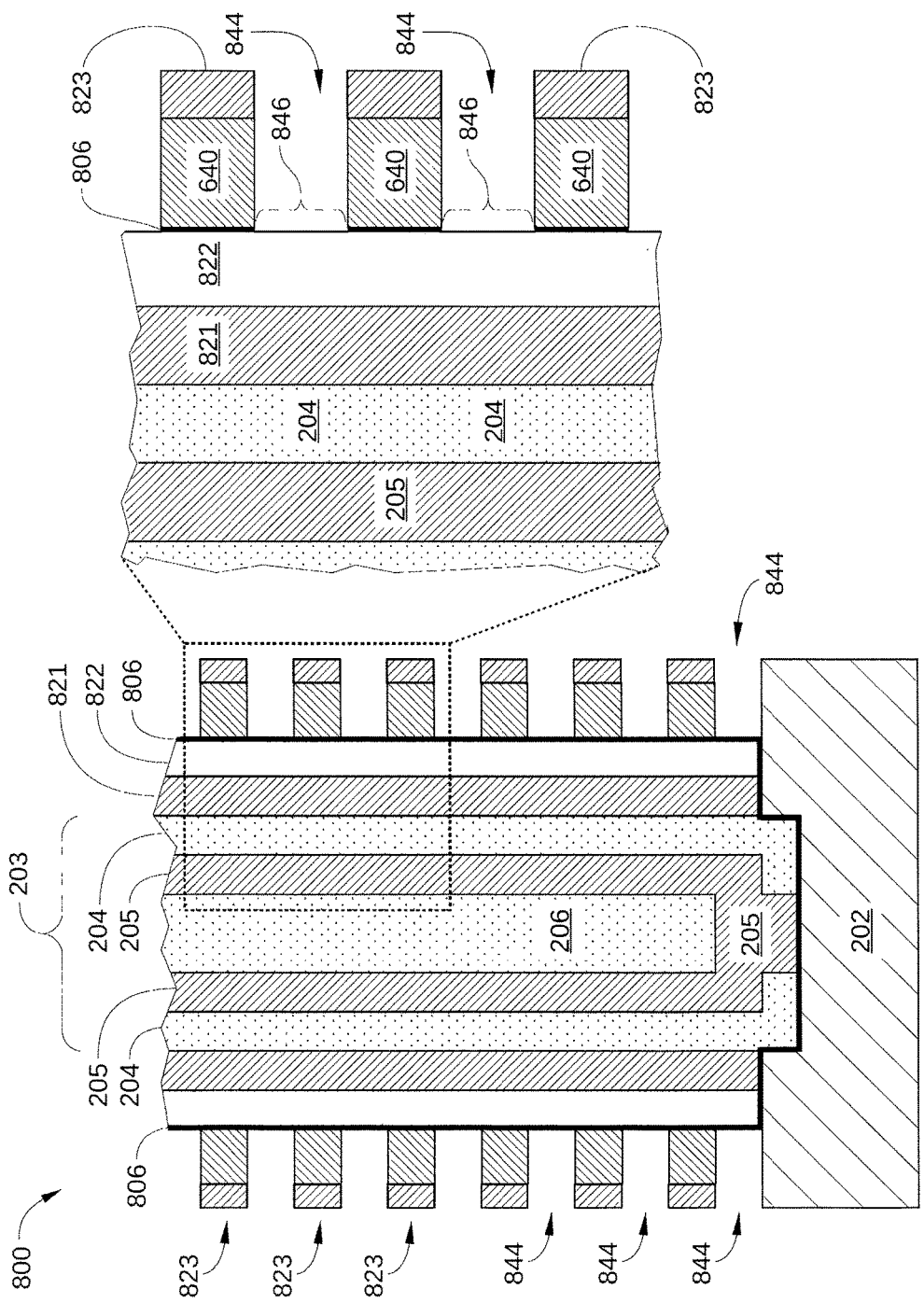

In step 705, a different selective etch process is performed to remove the exposed portions 845 of diffusion barrier layer 806. Thus, upon completion of step 705, diffusion barrier layer 806 is separated into separate portions, while portions 846 of gate oxide layer 822 are each exposed to one of air gaps 844, as shown in FIG. 8E. In some embodiments, an etch process that is highly selective to the material of semiconductor layers 640 and control gates 823 is employed in step 705. For example, one such process includes a gas phase etch using plasma effluents formed in a remote plasma, where the remote plasma excites a fluorine-containing precursor in combination with an oxygen-containing precursor. Plasma effluents within the remote plasma are flowed into a substrate processing region of a chamber, where the plasma effluents combine with water vapor or an alcohol. The combination reacts to remove an exposed silicon oxide with high selectivity, so that any exposed silicon nitride undergoes very little etching. One such high-selectivity silicon oxide etch process is described in U.S. Patent Publication 2016/0093505, entitled "Oxide Etch Selectivity Enhancement" and filed Oct. 31, 2014.

Figure 8F:
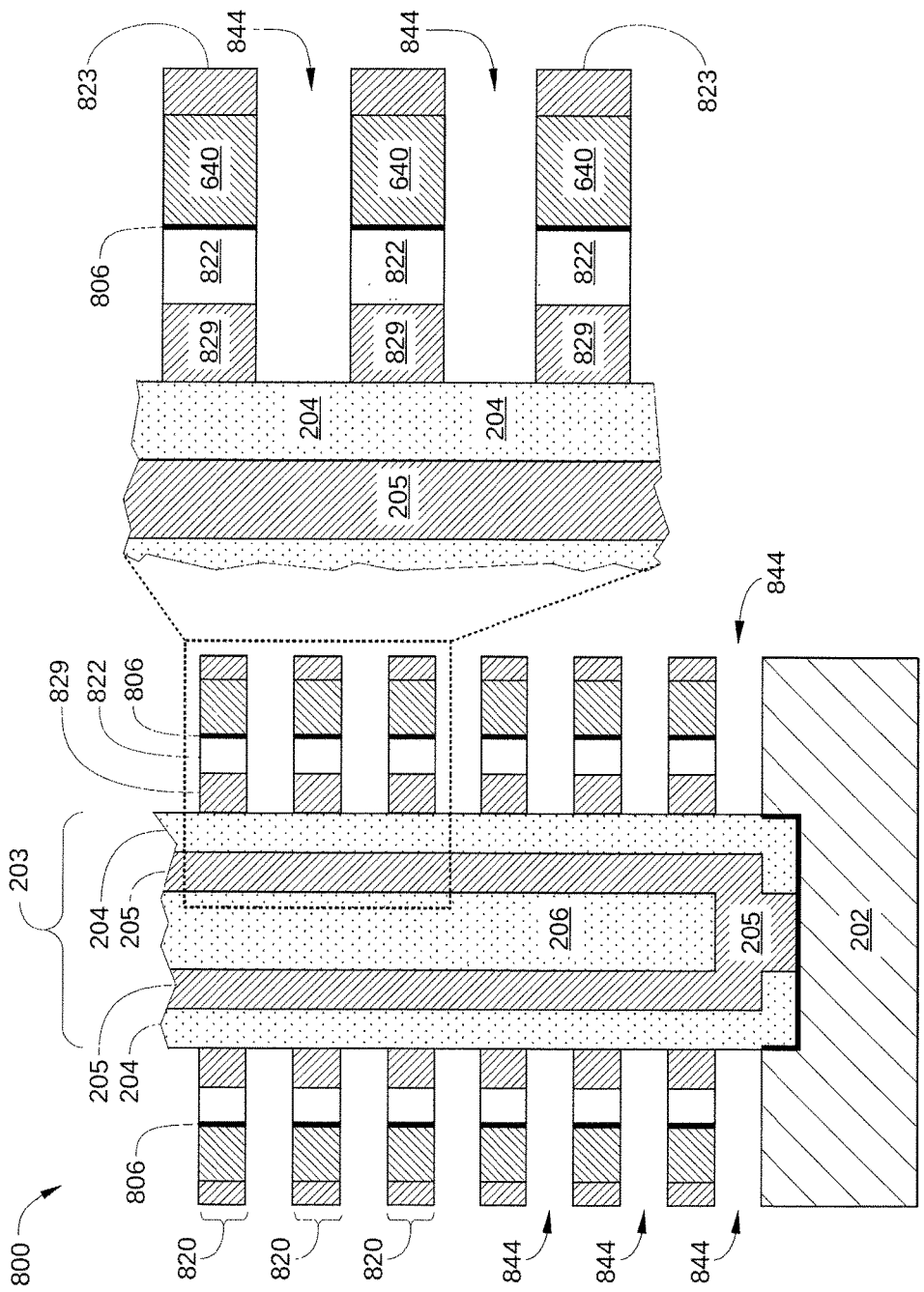

In step 706, a different selective etch process is performed to remove the exposed portions 846 of gate oxide layer 806 and portions of charge trap layer 821, to form charge trap regions 829, as shown in FIG. 8F. For example, in some embodiments, a process is employed in step 706 that is similar to the nitride recess process of step 302 in method 300, but with a chemistry modified to etch the material of gate oxide layer 806 and charge trap layer 821. Thus, upon completion of step 706, each of memory cells 820 is separated by air gaps 844 from adjacent memory cell gaps. Further, charge trap regions 829 are physically and electrically separated from each other, thereby preventing electron hopping or other leakage from occurring between memory cells 820.

While the foregoing is directed to embodiments of the present disclosure, other and further embodiments of the disclosure may be devised without departing from the basic scope thereof, and the scope thereof is determined by the claims that follow.

The invention claimed is:

1. A three-dimensional NAND device comprising:
  a first nonvolatile memory cell comprising a gate oxide layer and a first section extending orthogonally from the gate oxide layer, the first section comprising:
    a first charge trap region that contacts the gate oxide layer; and
    a first control gate separated from the first charge trap region by a first blocking oxide region; and
  a second nonvolatile memory cell comprising the gate oxide layer and a second section extending orthogonally from the gate oxide layer, wherein the first section and the second section are physically separated from each other by a gap, wherein the gap comprises an air gap and surfaces of the gate oxide layer are exposed to the air gap, the second section comprising:
    a second charge trap region that contacts the gate oxide layer; and
    a second control gate separated from the second charge trap region by a second blocking oxide region.

2. The device of claim 1, wherein an insulator layer is disposed within the gap.

3. The device of claim 1, wherein the first blocking oxide region and the second blocking oxide region are formed from a single blocking oxide layer.

4. The device of claim 3, wherein the single blocking oxide layer is separated into the first blocking oxide region and the second blocking oxide region by the air gap.

5. The device of claim 1, further comprising a diffusion barrier layer formed between the first control gate and the first blocking oxide region.

6. The device of claim 5, wherein the diffusion barrier layer is made of a high-k dielectric material.

7. The device of claim 5, further comprising a polysilicon channel formed adjacent the gate oxide layer.

8. The device of claim 7, further comprising a filler material formed adjacent the polysilicon channel.

9. A three-dimensional NAND device comprising:
a first nonvolatile memory cell comprising a gate oxide layer and a first section extending orthogonally from the gate oxide layer, the first section comprising:
   a first charge trap layer having a first surface and a second surface, the first surface of the first charge trap layer contacting a surface of the gate oxide layer, the second surface of the first charge trap layer contacting a first surface of a first blocking oxide layer;
   a first diffusion barrier layer having a first surface and a second surface, the first surface of the first diffusion barrier layer contacting a second surface of the first blocking oxide layer;
   a first conductive semiconductor layer having a first surface and a second surface, the first surface of the first conductive semiconductor layer contacting the second surface of the first diffusion barrier layer; and
   a first control gate contacting the second surface of the first conductive semiconductor layer; and
a second nonvolatile memory cell comprising the gate oxide layer and a second section extending orthogonally from the gate oxide layer, wherein the first section and the second section are physically separated from each other by a gap, wherein the gap comprises an air gap and surfaces of the gate oxide layer are exposed to the air gap, the second section comprising:
   a second charge trap layer having a first surface and a second surface, the first surface of the second charge trap layer contacting the surface of the gate oxide layer, the second surface of the second charge trap layer contacting a first surface of a second blocking oxide layer.

10. The device of claim 9, further comprising:
a second diffusion barrier layer having a first surface and a second surface, the first surface of the second diffusion barrier layer contacting a second surface of the second blocking oxide layer;
a second conductive semiconductor layer having a first surface and a second surface, the first surface of the second conductive semiconductor layer contacting the second surface of the second diffusion barrier layer; and
a second control gate contacting the second surface of the second conductive semiconductor layer.

11. The device of claim 9, wherein an insulator layer is disposed within the gap.

12. A three-dimensional NAND device comprising:
a first nonvolatile memory cell that includes:
   a first charge trap layer having a first surface and a second surface, the first surface of the first charge trap layer contacting a surface of a gate oxide layer, the second surface of the first charge trap layer contacting a first surface of a first blocking oxide layer;
   a first diffusion barrier layer having a first surface and a second surface, the first surface of the first diffusion barrier layer contacting a second surface of the first blocking oxide layer;
   a first conductive semiconductor layer having a first surface and a second surface, the first surface of the first conductive semiconductor layer contacting the second surface of the first diffusion barrier layer; and
   a first control gate contacting the second surface of the first conductive semiconductor layer; and
a second nonvolatile memory cell that is adjacent to the first nonvolatile memory cell and includes:
   a second charge trap layer having a first surface and a second surface, the first surface of the second charge trap layer contacting the surface of the gate oxide layer, the second surface of the second charge trap layer contacting a first surface of a second blocking oxide layer, wherein the second charge trap layer and the first charge trap layer are physically separated from each other by a gap, wherein the gap comprises an air gap and surfaces of the gate oxide layer are exposed to the air gap.

13. The device of claim 10, wherein the first blocking oxide layer and the second blocking oxide layer are formed from a single blocking oxide layer.

14. The device of claim 13, wherein the single blocking oxide layer is separated into the first blocking oxide layer and the second blocking oxide layer by the air gap.

15. The device of claim 9, wherein the first diffusion barrier layer is made of a high-k dielectric material.

16. The device of claim 9, further comprising a polysilicon channel formed adjacent the gate oxide layer.

17. A method for forming a three-dimensional NAND device comprising:
forming a first nonvolatile memory cell comprising a gate oxide layer and a first section extending orthogonally from the gate oxide layer, the first section comprising:
   forming a first charge trap region that contacts the gate oxide layer; and
   forming a first control gate separated from the first charge trap region by a first blocking oxide region; and
forming a second nonvolatile memory cell comprising the gate oxide layer and a second section extending orthogonally from the gate oxide layer, wherein the first section and the second section are physically separated from each other by a gap, wherein the gap comprises an air gap and surfaces of the gate oxide layer are exposed to the air gap, the second section comprising:
   forming a second charge trap region that contacts the gate oxide layer; and
   forming a second control gate separated from the second charge trap region by a second blocking oxide region.

* * * * *